US 10,083,989 B2

(12) United States Patent
Wang et al.

(10) Patent No.: US 10,083,989 B2
(45) Date of Patent: Sep. 25, 2018

(54) SEMICONDUCTOR DEVICE

(71) Applicant: Industrial Technology Research Institute, Hsinchu (TW)

(72) Inventors: Tai-Jui Wang, Kaohsiung (TW); Tsu-Chiang Chang, New Taipei (TW); Yu-Hua Chung, Pingtung County (TW); Wei-Han Chen, Taipei (TW); Hsiao-Chiang Yao, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 112 days.

(21) Appl. No.: 15/209,780

(22) Filed: Jul. 14, 2016

(65) Prior Publication Data
US 2017/0170207 A1    Jun. 15, 2017

(30) Foreign Application Priority Data

Dec. 10, 2015 (TW) .............................. 104141453 A
May 17, 2016 (TW) .............................. 105115124 A

(51) Int. Cl.
*H01L 29/786* (2006.01)
*H01L 27/12* (2006.01)

(52) U.S. Cl.
CPC ........ *H01L 27/1218* (2013.01); *H01L 27/124* (2013.01); *H01L 27/1222* (2013.01); *H01L 29/78675* (2013.01)

(58) Field of Classification Search
CPC ............. H01L 27/1218; H01L 27/1222; H01L 27/124; H01L 29/78675
See application file for complete search history.

(56) References Cited

U.S. PATENT DOCUMENTS

| 7,176,488 B2 | 2/2007 | Kim et al. |
| 7,221,012 B2 | 5/2007 | Chu et al. |
| 7,812,344 B2 | 10/2010 | Yan et al. |
| 8,373,168 B2 | 2/2013 | Yan et al. |
| 9,252,165 B2 | 2/2016 | Yan et al. |
| 2005/0266591 A1 | 12/2005 | Hideo |

(Continued)

FOREIGN PATENT DOCUMENTS

| CN | 101755335 | 6/2010 |
| CN | 103545321 | 1/2014 |

(Continued)

OTHER PUBLICATIONS

"Office Action of Taiwan Counterpart Application", dated Oct. 12, 2016, p. 1-p. 3.

*Primary Examiner* — Elias M Ullah
(74) *Attorney, Agent, or Firm* — JCIPRNET

(57) ABSTRACT

A semiconductor device is provided to include a flexible substrate, a barrier layer, a heat insulating layer, a device layer, a dielectric material later and a stress absorbing layer. The barrier layer is disposed on the flexible substrate. The heat insulating layer is disposed on the barrier layer, wherein the heat insulating layer has a thermal conductivity of less than 20 W/mK. The device layer is disposed on the heat insulating layer. The dielectric material layer is disposed on the device layer, and the dielectric material layer and the heat insulating layer include at least one trench. The stress absorbing layer is disposed on the dielectric material layer, and the stress absorbing layer fills into the at least one trench.

19 Claims, 21 Drawing Sheets

(56) References Cited

U.S. PATENT DOCUMENTS

| | | |
|---|---|---|
| 2013/0135830 A1 | 5/2013 | Lai et al. |
| 2014/0299884 A1 | 10/2014 | Park et al. |
| 2014/0301044 A1 | 10/2014 | Oh et al. |
| 2015/0091005 A1 | 4/2015 | Park |
| 2015/0348894 A1* | 12/2015 | Yan .................. H01L 23/564 257/774 |
| 2016/0111551 A1 | 4/2016 | Yan et al. |

FOREIGN PATENT DOCUMENTS

| | | |
|---|---|---|
| JP | 2008270797 | 11/2008 |
| TW | 201434077 | 9/2014 |
| TW | 201448691 | 12/2014 |
| TW | 201545290 | 12/2015 |

\* cited by examiner

SEMICONDUCTOR DEVICE

CROSS-REFERENCE TO RELATED APPLICATION

This application claims the priority benefit of Taiwan application serial no. 105115124, filed on May 17, 2016 and claims the priority benefit of Taiwan application serial no. 104141453, filed on Dec. 10, 2015. The entirety of each of the above-mentioned patent application is hereby incorporated by reference herein and made a part of this specification.

BACKGROUND OF THE DISCLOSURE

Technical Field

The present disclosure relates to a semiconductor device with flexibility.

Description of Related Art

Along with advances in technology, display panels have been developed in the directions of thinness and flexibility, wherein flexible display panels (flexible display) has gradually become the main direction for future development of display panels. Flexible substrate is generally used to replace traditional hard substrate in order to make flexible display panels which may be curled, easy to carry, and be in compliance with safety requirements as well as having a wide range of applicability in the product. However, to fulfil the requirements of future products and development, a panel with an even smaller bending radius of curvature is required to be manufactured. Based on conventional techniques, there still remains a problem of poor flexibility with panel structures currently on the market.

Generally speaking, a stress on a conventional flexible panel is concentrated at the thin film transistor. Due to an issue with stress distribution, the problem of poor flexibility causes the film layer of the panel to crack, such that the characteristics of the thin film transistor and the capacitance will drift and deteriorate. In order to improve this stress distribution, typically, important components are placed at a stress neutral axis region. However, since the panel assembly is overly complicated, the location of the actual stress neutral axis may deviate from design to reality, hence causing a lowered effect. Accordingly, how to improve current issues of stress distribution and poor panel flexibility is a subject desired to be researched.

SUMMARY

According to an embodiment of the disclosure, the semiconductor device includes a flexible substrate, a barrier layer, a heat insulating layer, a device layer, a dielectric material layer and a stress absorbing layer. The barrier layer is disposed on the flexible substrate. The heat insulating layer is disposed on the barrier layer, wherein the heat insulating layer has a thermal conductivity of less than 20 W/mK. The device layer is disposed on the heat insulating layer. The dielectric material layer is disposed on the device layer, wherein the dielectric material layer and the heat insulating layer include at least one trench. The stress absorbing layer is disposed on the dielectric material layer, and the stress absorbing layer fills into the at least one trench.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
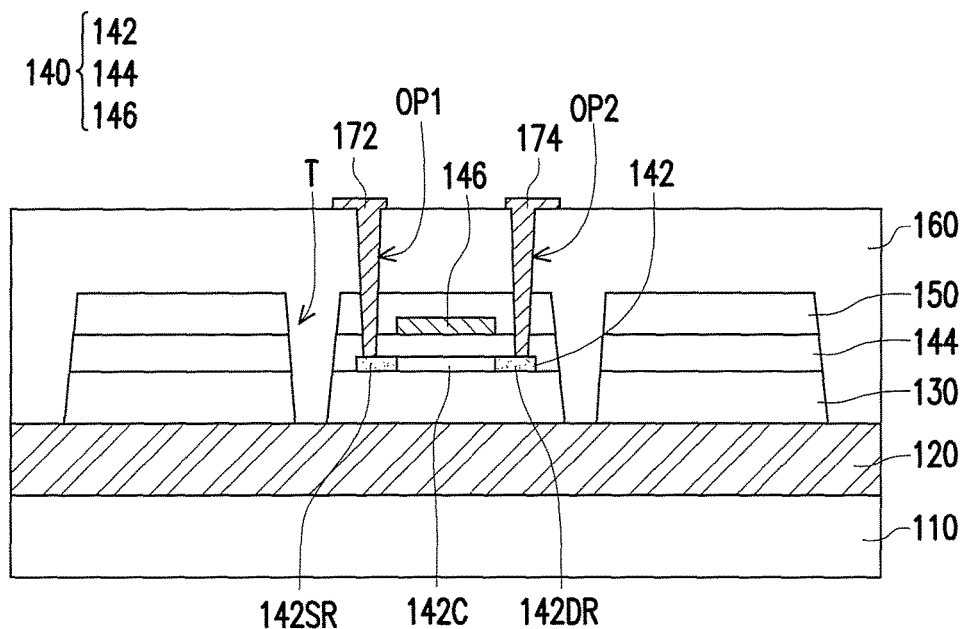
FIG. 1 is a cross-sectional schematic diagram of a semiconductor device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a cross-sectional schematic diagram of a semiconductor device according to an embodiment of the disclosure. Referring to FIG. 1, a semiconductor device of the present embodiment includes a flexible substrate 110, a barrier layer 120, a heat insulating layer 130, a device layer 140, a dielectric material layer 150 and a stress absorbing layer 160. The flexible substrate 110 may include an organic material such as polyimide (PI) or the same, having a tolerance temperature of lower than 500° C. The barrier layer 120 is disposed on the flexible substrate 110, wherein a water vapor transmission rate of the barrier layer 120 is smaller than $10^{-5}$ g/m$^2$/day and a thickness of the barrier layer 120 is smaller than 500 nm. The barrier layer 120 is an inorganic material and may be used to block water and/or block oxygen. The barrier layer 120 includes a plurality of layers of alternately stacked oxide material layers and nitride material layers, wherein a nitride material layer is located at the top of the barrier layer 120. The heat insulating layer 130 is disposed on the barrier layer 120, wherein the heat insulating layer 130 is a good thermal resistance material with a thermal conductivity coefficient less than 20 W/mK. A material of the heat insulating layer 130, for example, includes silicon oxide, silicon nitride, metal oxide or metal nitride. In addition, the nitride material layer of the barrier layer 120 is in contact with the heat insulating layer 130.

The device layer 140 is disposed on the heat insulating layer 130. In the present embodiment, the device layer 140 includes a plurality of active devices (only one is illustrated in the figure for explanation purposes), wherein each of the active device includes a polysilicon layer 142, a gate insulation layer 144 and a gate 146. The polysilicon layer 142 includes a source region 142SR, a drain region 142DR and a channel region 142C located between the source region 142SR and the drain region 142DR. The gate insulation layer 144 is disposed on the polysilicon layer 142, and the gate 146 is disposed on the gate insulation layer 144.

The dielectric material layer 150 is disposed on the device layer 140, wherein the dielectric material layer 150, the gate insulation layer 144 and the heat insulating layer 130 includes at least one trench T. The at least one trench T penetrates the dielectric material layer 150 and the heat insulating layer 130 and exposes an upper surface of the barrier layer 120. The stress absorbing layer 160 is disposed on the dielectric material layer 150, and the stress absorbing layer 160 fills into the at least one trench T. The stress absorbing layer 160, for example, is an organic material. The semiconductor device of the present embodiment further includes source electrode 172 and drain electrode 174. The source electrode 172 is connected with the source region 142SR through a first opening OP1, wherein the first opening OP1 penetrates the stress absorbing layer 160, the dielectric material layer 150 and the gate insulation layer 144. The drain electrode 174 is connected with the drain region 142DR through a second opening OP2, wherein the second opening OP2 penetrates the stress absorbing layer 160, the dielectric material layer 150 and the gate insulation layer 144.

In the present embodiment, the heat insulating layer 130 located below the dielectric material layer 150, the gate insulation layer 144 and the polysilicon layer 142 has the at least one trench T through patterning. Therefore, the stress absorbing layer 160 may be filled into the trench T of the dielectric material layer 150 and the heat insulating layer 130. Accordingly, during flexing of a product with a semiconductor device having the aforementioned structure, it is possible for the flex to be within an elastic deformation range, or to change within a linear deformation range. The definition of the elastic deformation range includes a non-linear deformation range and the linear deformation range (satisfying Hooke's law). Basically, the deformation of an object generated by an applied force is restorable when the object is manipulated in the elastic deformation range. In other words, the aforementioned structure may be used to improve the poor stress distribution, and the flexibility of the semiconductor may be increased and may protect the semiconductor device.

Figure 2A:
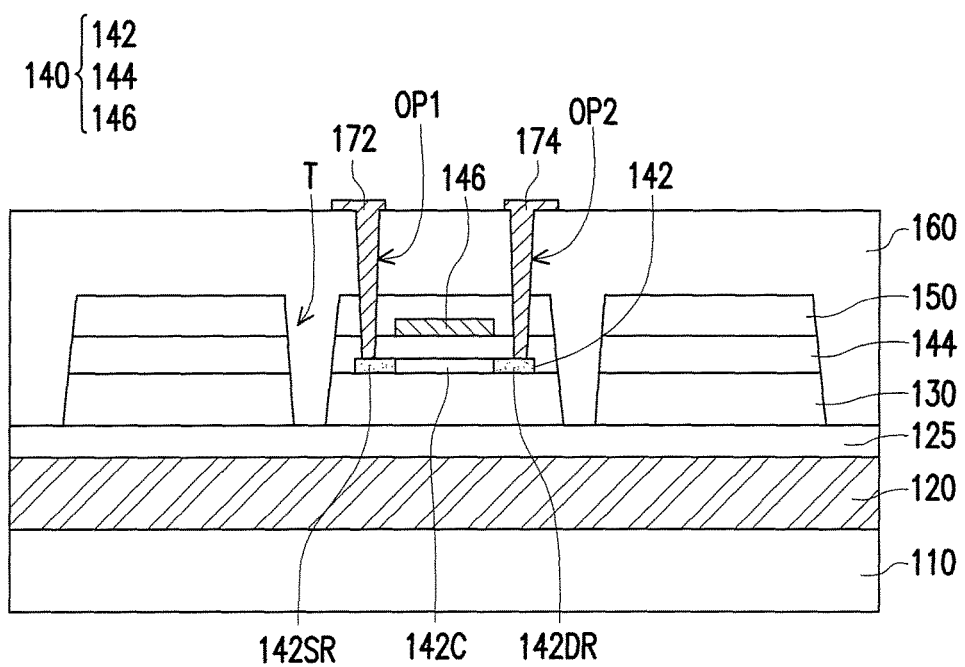
FIG. 2A is a cross-sectional schematic diagram of a semiconductor device according to another embodiment of the disclosure.

FIG. 2A is a cross-sectional schematic diagram of a semiconductor device according to another embodiment of the disclosure. The semiconductor device of FIG. 2A is similar with that of FIG. 1, therefore the same reference numbers are used to refer to the same or like parts and its description will not be repeated herein. The difference between FIG. 2A and FIG. 1 lies in the semiconductor device of FIG. 2A further includes an etching stop layer 125. The etching stop layer 125 is located between the barrier layer 120 and the heat insulating layer 130, and the at least one trench T exposes the etching stop layer 125. The etching stop layer 125 is a single metallic layer, ceramic layer or a structure with a combination of stacked ceramic/metal layers, and the etching stop layer 125 may be used to control an etching depth of the heat insulating layer 130.

Similarly, in the semiconductor device of FIG. 2A, the dielectric material layer 150, the gate insulation layer 144 and the heat insulating layer 130 have the at least one trench T through patterning, therefore the stress absorbing layer 160 may be filled into the trench T of the dielectric material layer 150, the gate insulation layer 144 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 2B:
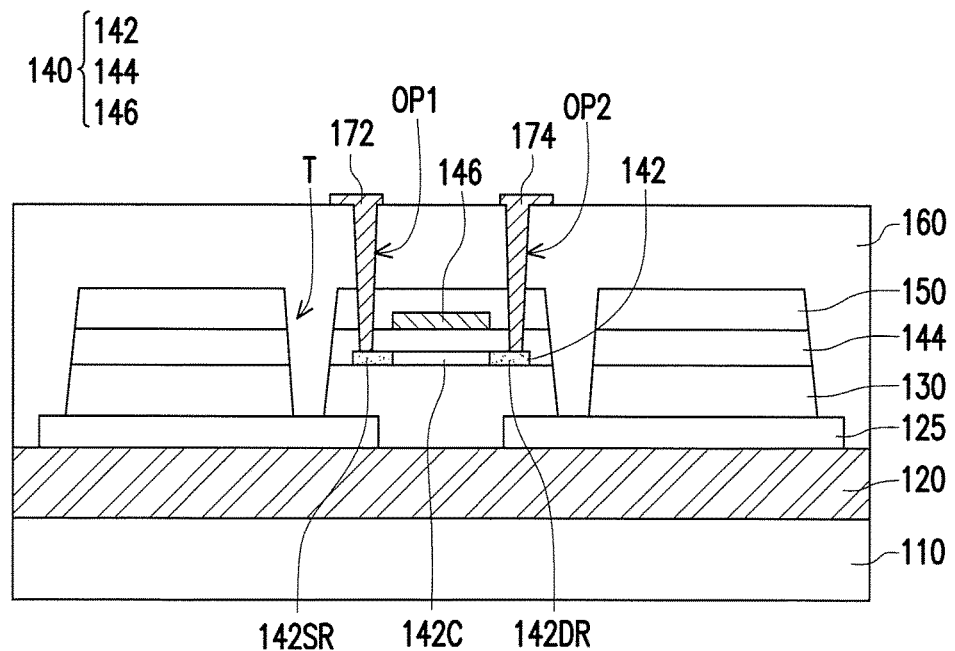
FIG. 2B is a cross-sectional schematic diagram of a semiconductor device according to another embodiment of the disclosure.

FIG. 2B is a cross-sectional schematic diagram of a semiconductor device according to another embodiment of the disclosure. The semiconductor device of FIG. 2B is similar with that of FIG. 2A, therefore the same reference numbers are used to refer to the same or like parts and its description will not be repeated herein. The difference between FIG. 2B and FIG. 2A lies in the etching stop layer 125 of FIG. 2B is a patterned etching stop layer 125, and the at least one trench T exposes the etching stop layer 125. In addition, the etching stop layer 125 is disposed to not overlap the gate 146 of the device layer 140, therefore the effect of the parasitic capacitance may be reduced.

Similarly, in the semiconductor device of FIG. 2B, the dielectric material layer 150, the gate insulation layer 144 and the heat insulating layer 130 have the at least one trench T through patterning, therefore the stress absorbing layer 160 may be filled into the trench T of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 2C:
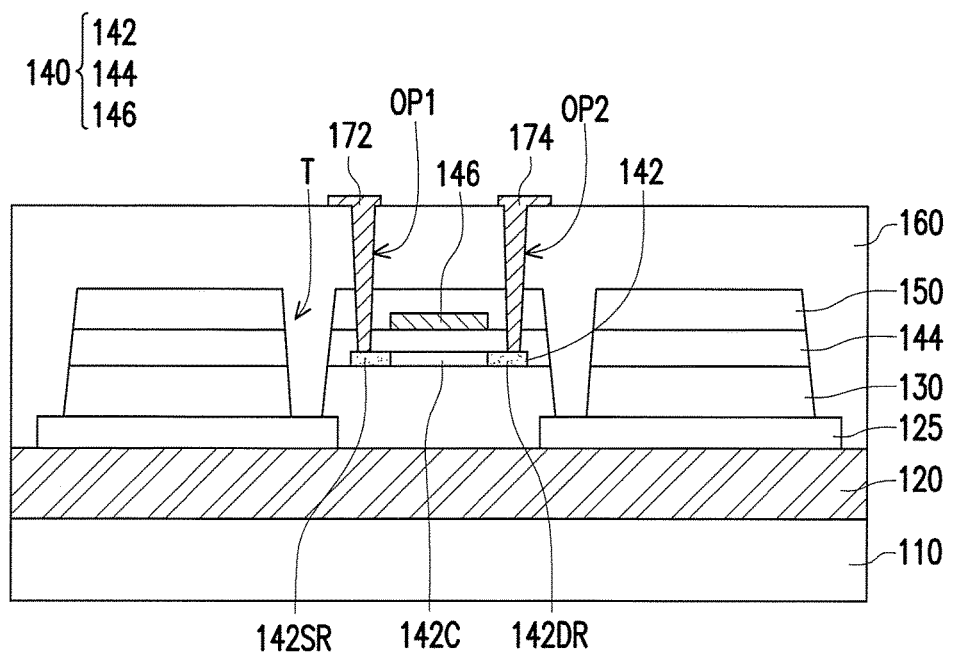
FIG. 2C is a cross-sectional schematic diagram of a semiconductor device according to another embodiment of the disclosure.

FIG. 2C is a cross-sectional schematic diagram of a semiconductor device according to another embodiment of the disclosure. The semiconductor device of FIG. 2C is similar with that of FIG. 2B, therefore the same reference numbers are used to refer to the same or like parts and its description will not be repeated herein. The difference between FIG. 2C and FIG. 2B lies in, the etching stop layer 125 in FIG. 2C is disposed to not overlap the polysilicon layer 142 of the device layer 140, therefore the effect of the parasitic capacitance may be further reduced.

Similarly, in the semiconductor device of FIG. 2C, the dielectric material layer 150, the gate insulation layer 144 and the heat insulating layer 130 have the at least one trench T through patterning, therefore the stress absorbing layer 160 may be filled into the trench T of the dielectric material layer 150, the gate insulation layer 144 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

In the aforementioned embodiments, it is mainly described that the dielectric material layer 150, the gate insulation layer 144 and the heat insulating layer 130 have the at least one trench T. Various embodiments of the location where the at least one trench is disposed will be described in detail below.

Figure 3:
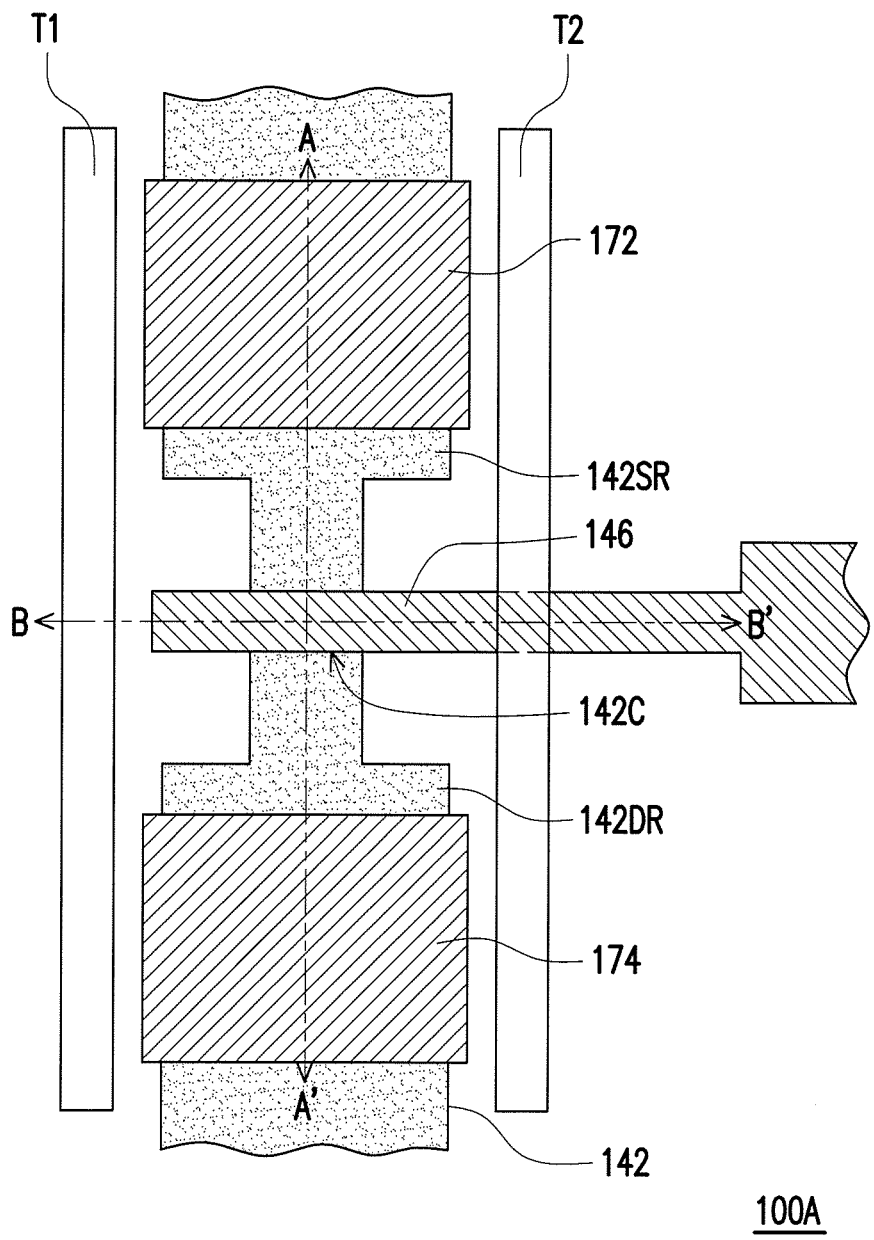
FIG. 3 is a plan view schematic diagram of a semiconductor device according to a first embodiment of the disclosure.
Figure 4A:
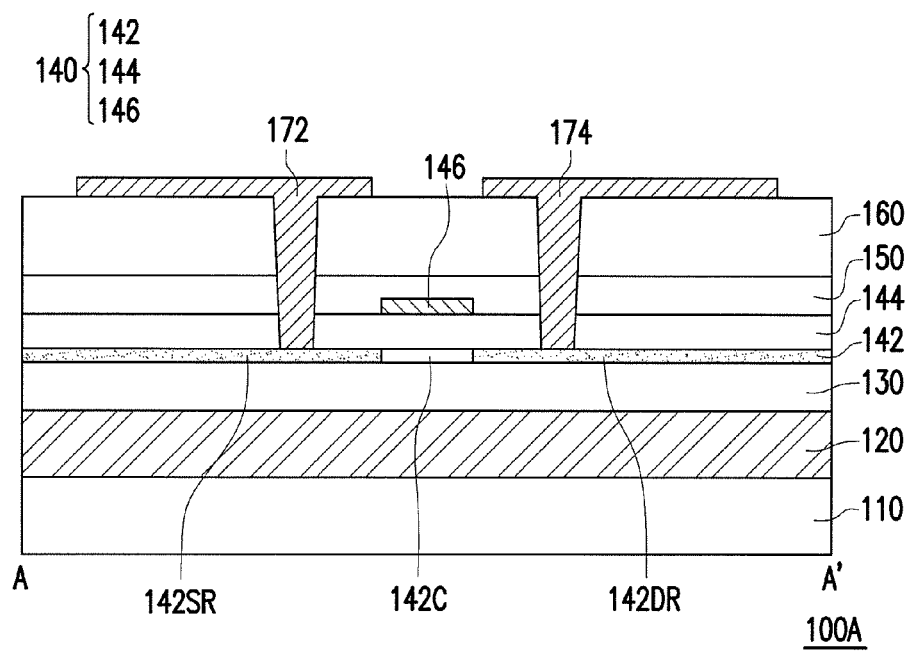
FIG. 4A is a cross sectional schematic diagram along the section line A-A' of FIG. 3.
Figure 4B:
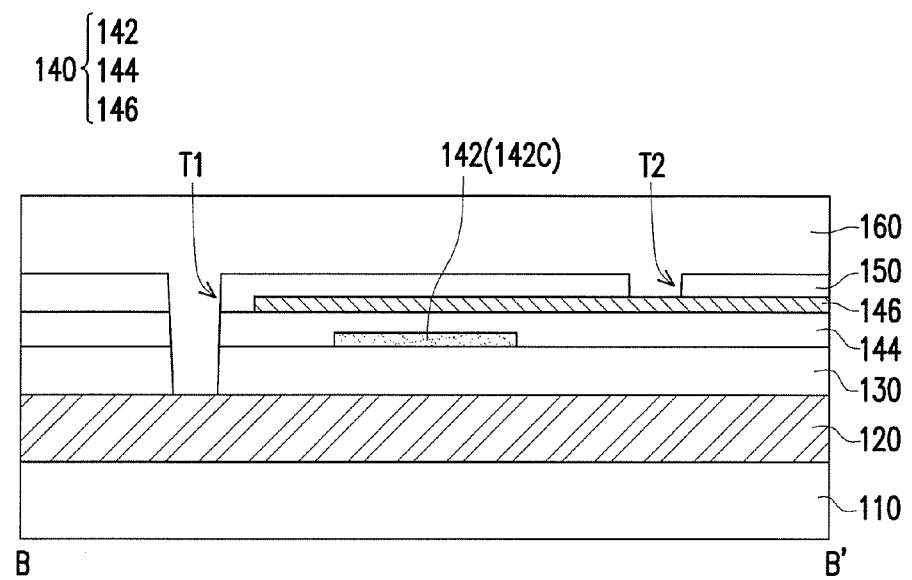
FIG. 4B is a cross sectional schematic diagram along the section line B-B' of FIG. 3.

FIG. 3 is a plan view schematic diagram of a semiconductor device according to a first embodiment of the disclosure. FIG. 4A is a cross sectional schematic diagram along the section line A-A' of FIG. 3. FIG. 4B is a cross sectional schematic diagram along the section line B-B' of FIG. 3. Referring to FIG. 3, FIG. 4A and FIG. 4B at the same time, the semiconductor device 100A of the present embodiment is similar with the semiconductor device of FIG. 1, therefore the same reference numbers are used to refer to the same or like parts and its description will not be repeated herein. The difference between the semiconductor device 100A of FIG. 3 and the semiconductor device of FIG. 1 lies in the difference of the location of the at least one trench. In the present embodiment, the at least one trench includes a first trench T1 and a second trench T2. The first trench T1 and the second trench T2 are located at two sides of the polysilicon layer 142; the first trench T1 is disposed to not overlap the gate 146 and the second trench T2 is disposed to overlap the gate 146. In other words, the first trench T1 penetrates the dielectric material layer 150 and the heat insulating layer 130 and exposes the upper surface of the barrier layer 120; and the second trench T2 further exposes an upper surface of the gate 146.

Similarly, in the semiconductor device of FIG. 4A and FIG. 4B, the dielectric material layer 150, the gate insulation layer 144 and the heat insulating layer 130 have the first trench T1 and the second trench T2 through patterning, therefore the stress absorbing layer 160 may be filled into the first trench T1 and the second trench T2 of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 5:
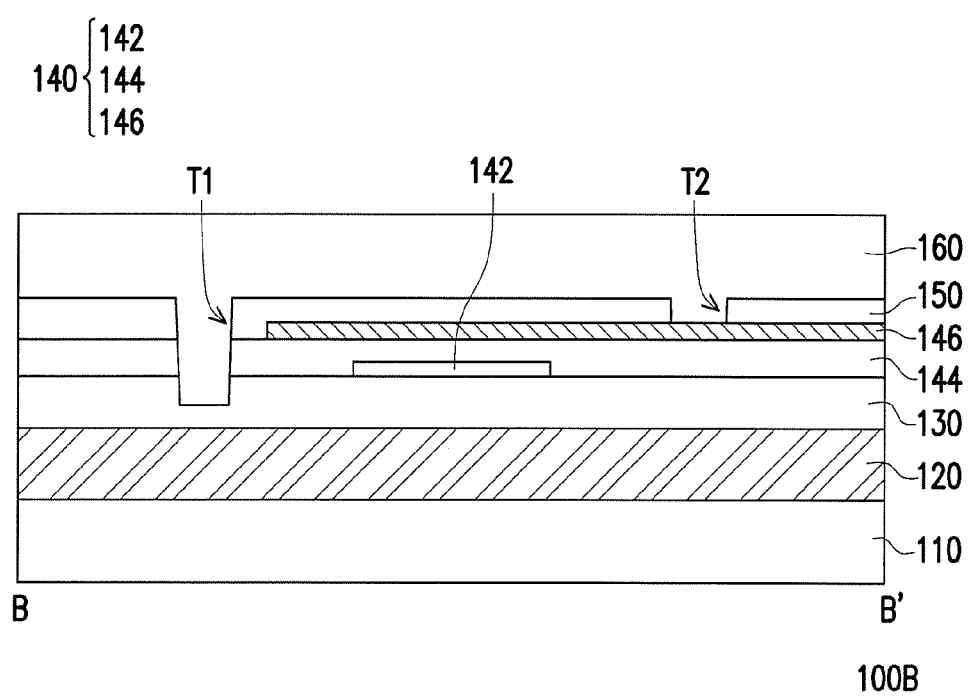
FIG. 5 is a cross sectional schematic diagram along the section line B-B' of FIG. 3. according to another embodiment.

FIG. 5 is a cross sectional schematic diagram along the section line B-B' of FIG. 3 according to another embodiment. The embodiment of FIG. 5 is similar to the embodiment of FIG. 4B, therefore the same reference numbers are used to refer to the same or like parts and its description will not be repeated herein. The difference between the semiconductor device 100B of FIG. 5 and the semiconductor device 100A of FIG. 4B lies in the first trench T1 of FIG. 4B penetrates the dielectric material layer 150 and the heat insulating layer 130 and exposes the upper surface of the barrier layer 120. In comparison, in the embodiment of FIG. 5, the first trench T1 penetrates the dielectric material layer 150 and extends into the heat insulating layer 130, but does not penetrate the heat insulating layer 130. That is to say, the first trench T1 of the present embodiment exposes the heat insulating layer 130, and the second trench T2 further exposes the upper surface of the gate 146.

Similarly, in the semiconductor device 100B of FIG. 5, the dielectric material layer 150, the gate insulation layer 144 and the heat insulating layer 130 have the first trench T1 and the second trench T2 through patterning, therefore the stress absorbing layer 160 may be filled into the first trench T1 and the second trench T2 of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 6:
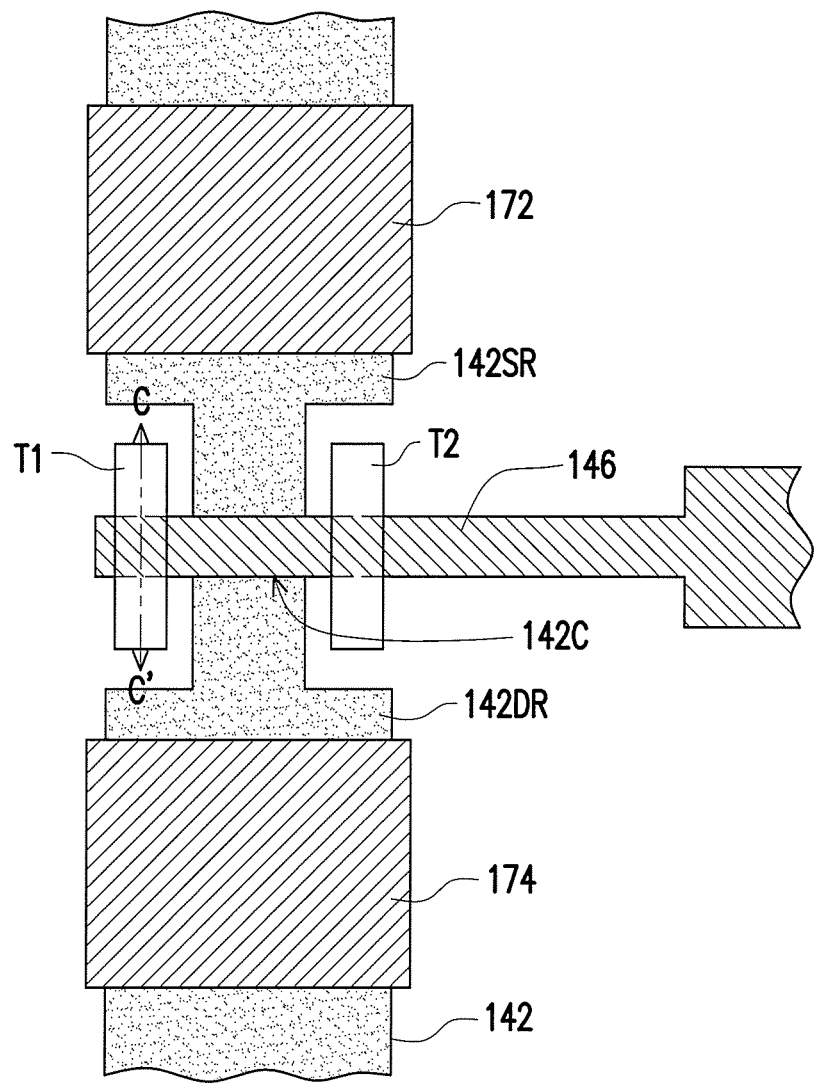
FIG. 6 is a plan view schematic diagram of a semiconductor device according to a second embodiment of the disclosure.
Figure 7:
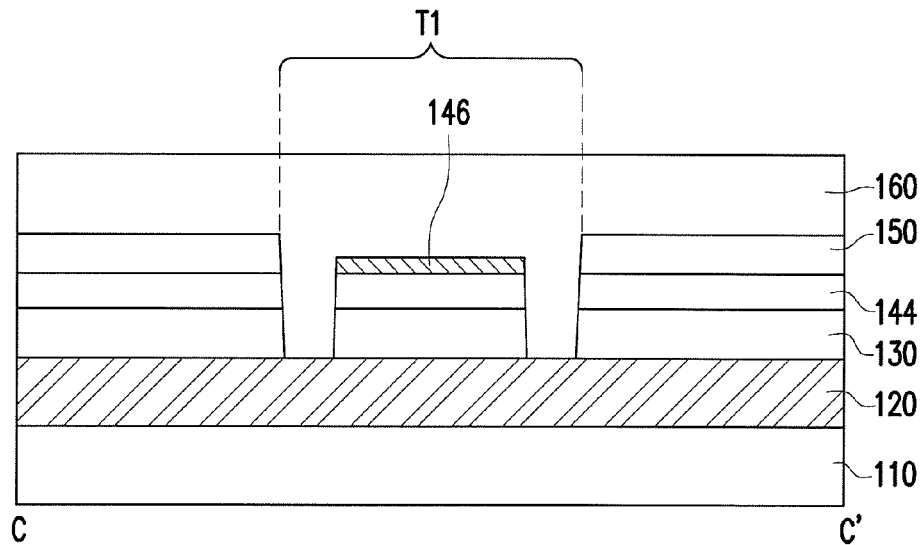
FIG. 7 is a cross sectional schematic diagram along the section line C-C' of FIG. 6.

FIG. 6 is a plan view schematic diagram of a semiconductor device according to a second embodiment of the disclosure. FIG. 7 is a cross sectional schematic diagram along the section line C-C' of FIG. 6. Referring to FIG. 6 and FIG. 7 at the same time, the semiconductor device 200A of the present embodiment is similar with the semiconductor device 100A of FIG. 3, therefore the same reference numbers are used to refer to the same or like parts and its description will not be repeated herein. The difference between the semiconductor device 200A of FIG. 6 and the semiconductor device 100A of FIG. 3 lies in the difference of the location of the at least one trench. In the present embodiment, the at least one trench includes the first trench T1 and the second trench T2. The first trench T1 and the second trench T2 are located at two sides of the polysilicon layer 142; and the first trench T1 and the second trench T2 are disposed to overlap with the gate 146. In other words, the first trench T1 and the second trench T2 penetrate the dielectric material layer 150, the gate insulation layer 144 and the heat insulating layer 130 and exposes the upper surface of the barrier layer 120; but also exposes the upper surface of the gate 146 at the same time.

Similarly, in the semiconductor device 200A of FIG. 7, the dielectric material layer 150, the gate insulation layer 144 and the heat insulating layer 130 have the first trench T1 and the second trench T2 through patterning, therefore the stress absorbing layer 160 may be filled into the first trench T1 and the second trench T2 of the dielectric material layer 150 and the heat insulating layer 130. Accordingly, during flexing of a product with a semiconductor device having the aforementioned structure, it is possible for the flex to be within an elastic deformation range, or change within a linear deformation range. In other words, the aforementioned structure may be used to improve the poor stress distribution, and the flexibility of the semiconductor may be increased and may protect the semiconductor device.

Figure 8:
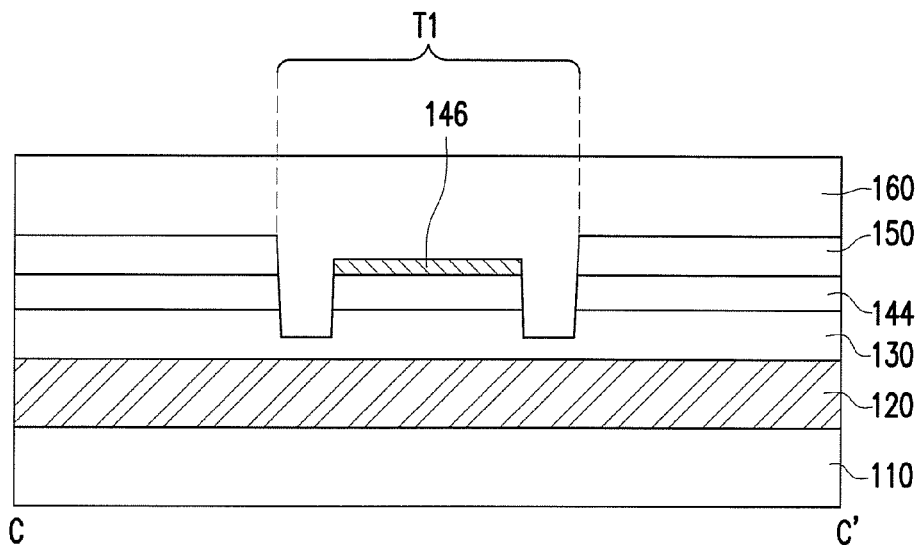
FIG. 8 is a cross sectional schematic diagram along the section line C-C' of FIG. 6. according to another embodiment.

FIG. 8 is a cross sectional schematic diagram along the section line C-C' of FIG. 6 according to another embodiment. The embodiment of FIG. 8 is similar to the embodiment of FIG. 7, therefore the same reference numbers are used to refer to the same or like parts and its description will not be repeated herein. The difference between the semiconductor device 200B of FIG. 8 and the semiconductor device 200A of FIG. 7 lies in the first trench T1 and the second trench T2 of FIG. 7 penetrate the dielectric material layer 150, the gate insulation layer 144 and the heat insulating layer 130 and exposes the upper surface of the barrier layer 120. In comparison, in the embodiment of FIG. 8, the first trench T1 and the second trench T2 penetrate the dielectric material layer 150 and extend into the heat insulating layer 130, but do not penetrate the heat insulating layer 130. That is to say, the first trench T1 and the second trench T2 of the present embodiment exposes the heat insulating layer 130; but also exposes the upper surface of the gate 146 at the same time.

Similarly, in the semiconductor device 200B of FIG. 8, the dielectric material layer 150, the gate insulation layer 144 and the heat insulating layer 130 have the first trench T1 and the second trench T2 through patterning, therefore the stress absorbing layer 160 may be filled into the first trench T1 and the second trench T2 of the dielectric material layer 150, the gate insulation layer 144 and the heat insulating layer 130. Accordingly, during flexing of a product with a semiconductor device having the aforementioned structure, it is possible for the flex to be within an elastic deformation range, or change within a linear deformation range. In other words, the aforementioned structure may be used to improve the poor stress distribution, and the flexibility of the semiconductor may be increased and may protect the semiconductor device.

Figure 9:
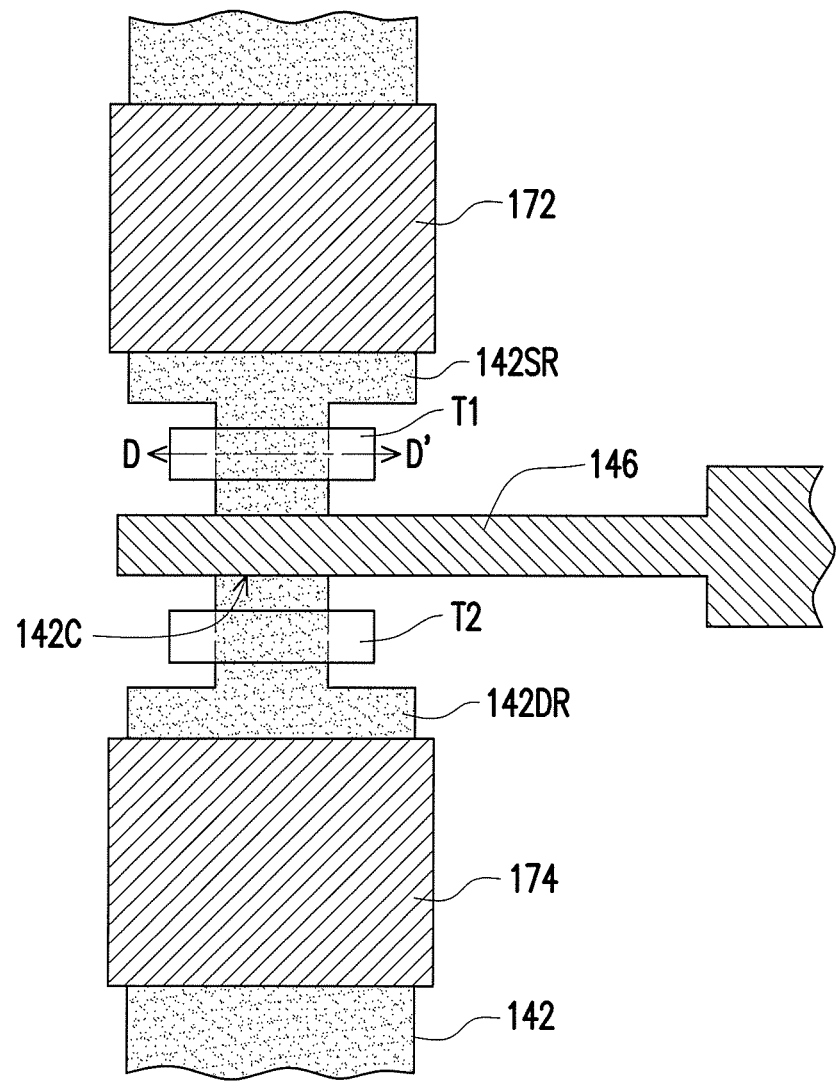
FIG. 9 is a plan view schematic diagram of a semiconductor device according to a third embodiment of the disclosure.
Figure 10:
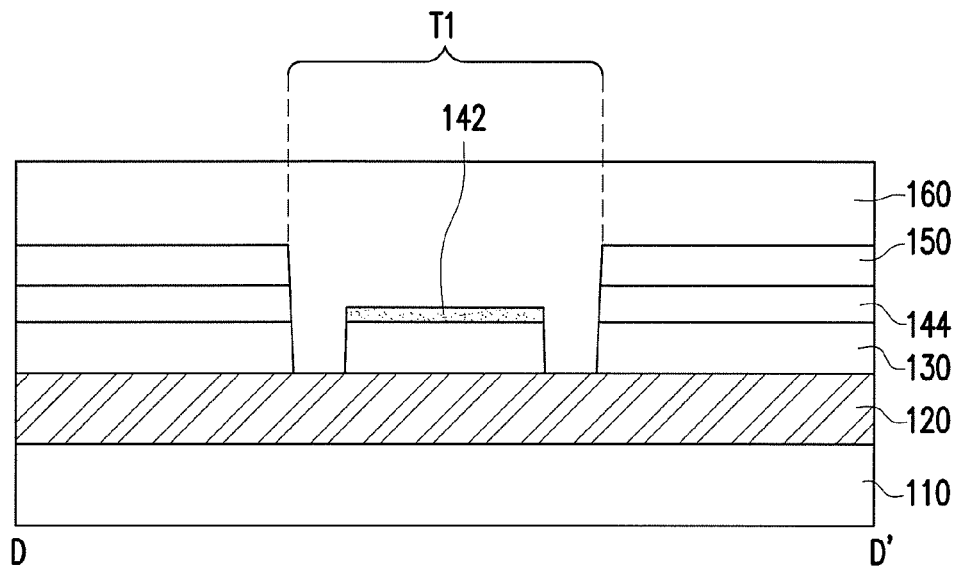
FIG. 10 is a cross sectional schematic diagram along the section line D-D' of FIG. 9.

FIG. 9 is a plan view schematic diagram of a semiconductor device according to a third embodiment of the disclosure. FIG. 10 is a cross sectional schematic diagram along the section line D-D' of FIG. 9. Referring to FIG. 9 and FIG. 10 at the same time, the semiconductor device 300A of the present embodiment is similar with the semiconductor device 100A of FIG. 3, therefore the same reference numbers are used to refer to the same or like parts and its description will not be repeated herein. The difference between the semiconductor device 300A of FIG. 9 and the semiconductor device 100A of FIG. 3 lies in the difference of the location of the at least one trench. In the present embodiment, the at least one trench includes the first trench T1 and the second trench T2. The first trench T1 and the second trench T2 are located at two sides of gate 146; and the first trench T1 and the second trench T2 are disposed to overlap with the polysilicon layer 142. In other words, the first trench T1 and the second trench T2 penetrate the dielectric material layer 150 and the heat insulating layer 130 and expose the upper surface of the barrier layer 120; but also expose the upper surface of the polysilicon layer 142 at the same time.

Similarly, in the semiconductor device 300A of FIG. 10, the dielectric material layer 150, the gate insulation layer 144 and the heat insulating layer 130 have the first trench T1 and the second trench T2 through patterning, therefore the stress absorbing layer 160 may be filled into the first trench T1 and the second trench T2 of the dielectric material layer 150, the gate insulation layer 144 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 11:
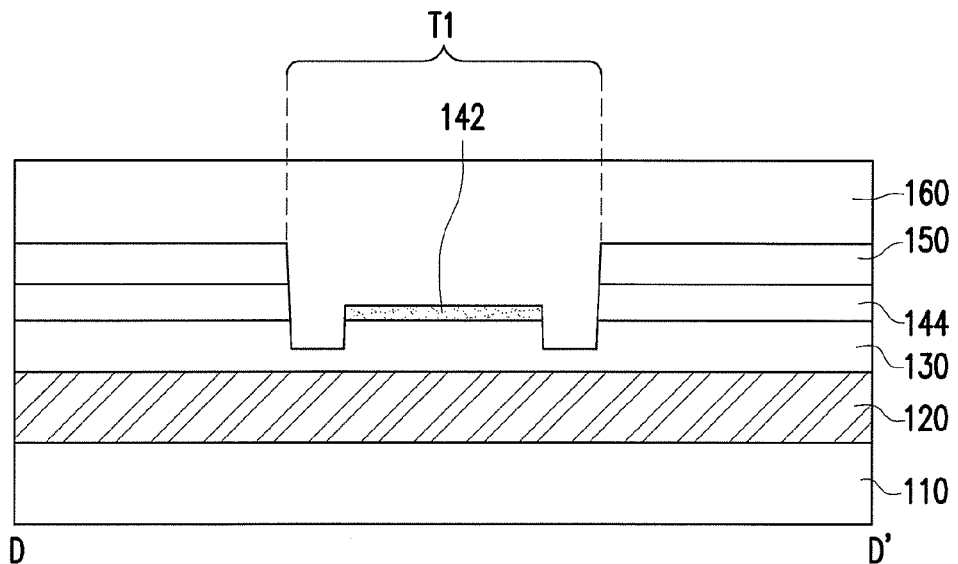
FIG. 11 is a cross sectional schematic diagram along the section line D-D' of FIG. 9. according to another embodiment.

FIG. 11 is a cross sectional schematic diagram along the section line D-D' of FIG. 9 according to another embodiment. The embodiment of FIG. 11 and the embodiment of FIG. 10 are similar, therefore the same reference numbers are used to refer to the same or like parts and its description will not be repeated herein. The difference between the semiconductor device 300B of FIG. 11 and the semiconductor device 300A of FIG. 10 lies in the first trench T1 and the second trench T2 of FIG. 10 penetrate the dielectric material layer 150 and the heat insulating layer 130 and exposes the upper surface of the barrier layer 120. In comparison, in the embodiment of FIG. 11, the first trench T1 and the second trench T2 penetrate the dielectric material layer 150 and extend into the heat insulating layer 130, but do not penetrate the heat insulating layer 130. That is to say, the first trench T1 and the second trench T2 of the present embodiment exposes the heat insulating layer 130; but also exposes the upper surface of the polysilicon layer 142 at the same time.

Figure 12:
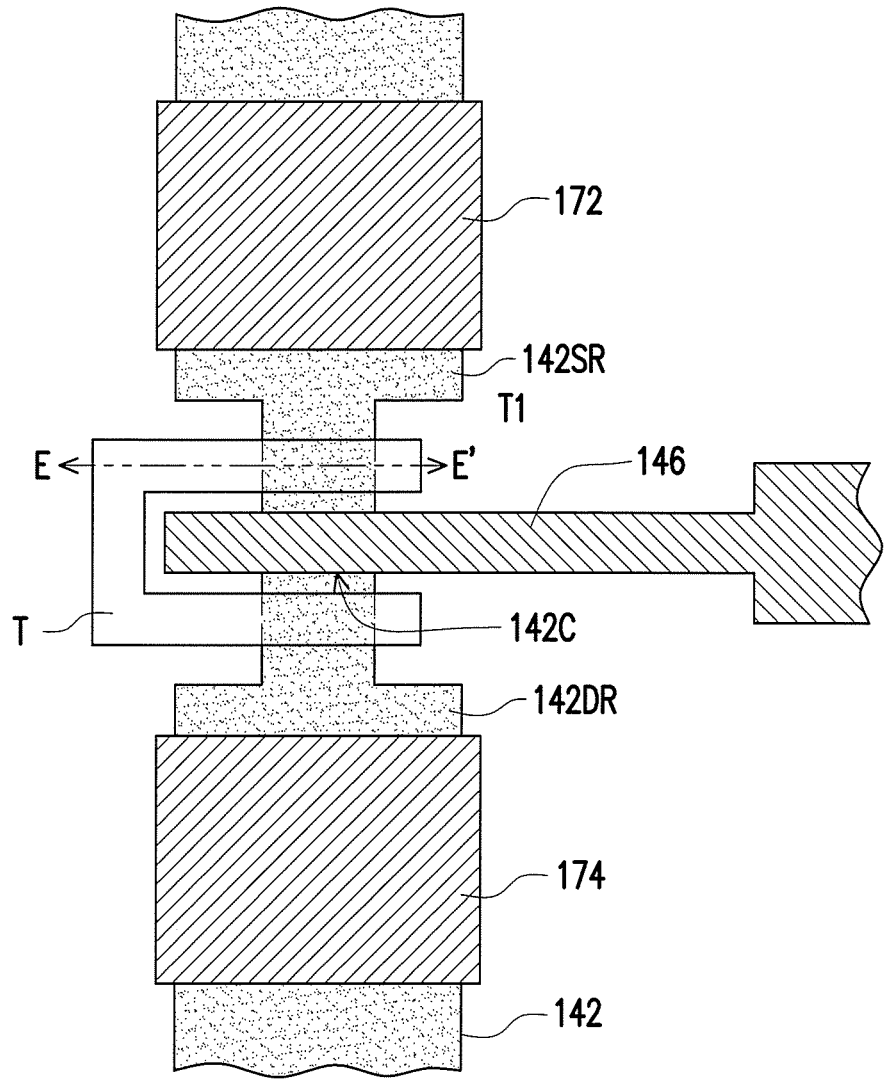
FIG. 12 is a plan view schematic diagram of a semiconductor device according to a fourth embodiment of the disclosure.
Figure 13:
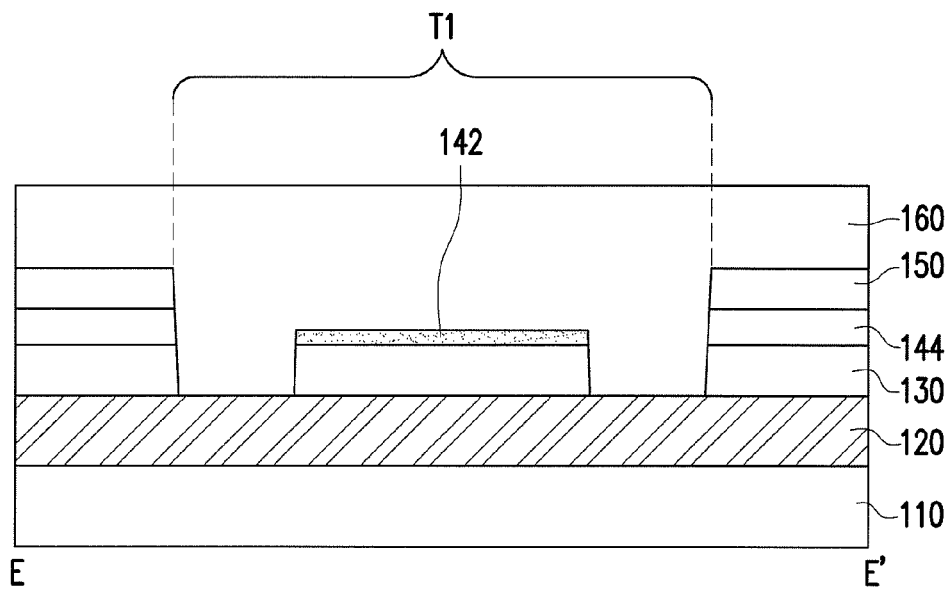
FIG. 13 is a cross sectional schematic diagram along the section line E-E' of FIG. 12.

Similarly, in the semiconductor device 300B of FIG. 11, the dielectric material layer 150 and the heat insulating layer 130 have the first trench T1 and the second trench T2 through patterning, therefore the stress absorbing layer 160 may be filled into the first trench T1 and the second trench T2 of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

FIG. 12 is a plan view schematic diagram of a semiconductor device according to a fourth embodiment of the disclosure. FIG. 13 is a cross sectional schematic diagram along the section line E-E' of FIG. 12. Referring to FIG. 12 and FIG. 13 at the same time, the semiconductor device 400A of the present embodiment is similar with the semiconductor device 100A of FIG. 3, therefore the same reference numbers are used to refer to the same or like parts and its description will not be repeated herein. The difference between the semiconductor device 400A of FIG. 12 and the semiconductor device 100A of FIG. 3 lies in the difference of the location of the at least one trench. In the present embodiment, the at least one trench T surrounds the gate 146, and the at least one trench T is disposed to overlap the polysilicon layer 142. In other words, the at least one trench T penetrates the dielectric material layer 150 and the heat insulating layer 130 and exposes the upper surface of the barrier layer 120; but also exposes the upper surface of the polysilicon layer 142 at the same time.

Similarly, in the semiconductor device 400A of FIG. 13, the dielectric material layer 150 and the heat insulating layer 130 have the at least one trench T through patterning, therefore the stress absorbing layer 160 may be filled into the at least one trench T of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 14:
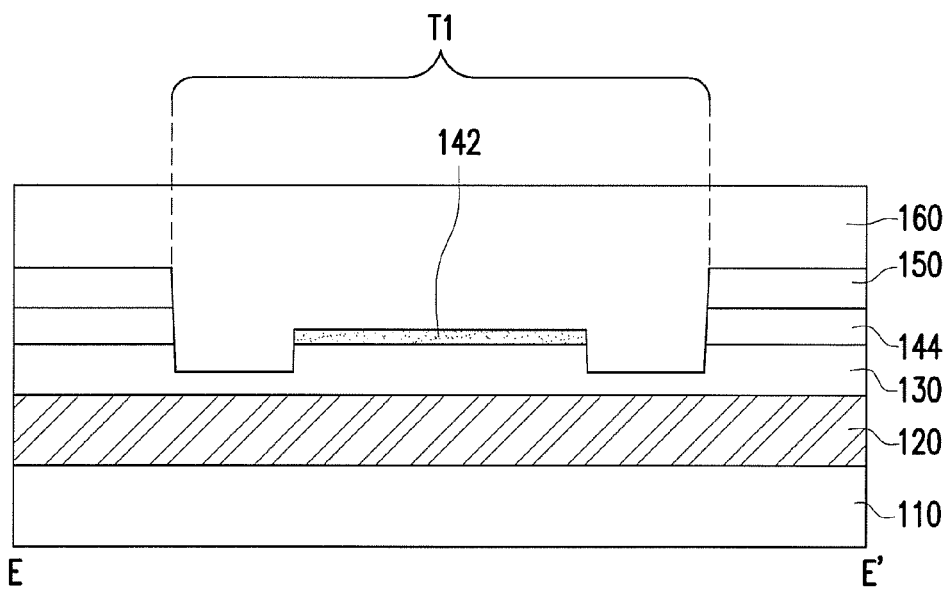
FIG. 14 is a cross sectional schematic diagram along the section line E-E' of FIG. 12 according to another embodiment.

FIG. 14 is a cross sectional schematic diagram along the section line E-E' of FIG. 12 according to another embodiment. The embodiment of FIG. 14 is similar to the embodiment of FIG. 13, therefore the same reference numbers are used to refer to the same or like parts and its description will not be repeated herein. The difference between the semiconductor device 400B of FIG. 14 and the semiconductor device 400A of FIG. 13 lies in the at least one trench T of FIG. 13 penetrate the dielectric material layer 150 and the heat insulating layer 130 and exposes the upper surface of the barrier layer 120. In comparison, in the embodiment of FIG. 14, the at least one trench T penetrates the dielectric material layer 150 and extends into the heat insulating layer 130, but does not penetrate the heat insulating layer 130. That is to say, the at least one trench T of the present embodiment exposes the heat insulating layer 130; but also exposes the upper surface of the polysilicon layer 142 at the same time.

Similarly, in the semiconductor device 400B of FIG. 14, the dielectric material layer 150 and the heat insulating layer 130 have the at least one trench T through patterning, therefore the stress absorbing layer 160 may be filled into the at least one trench T of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 15:
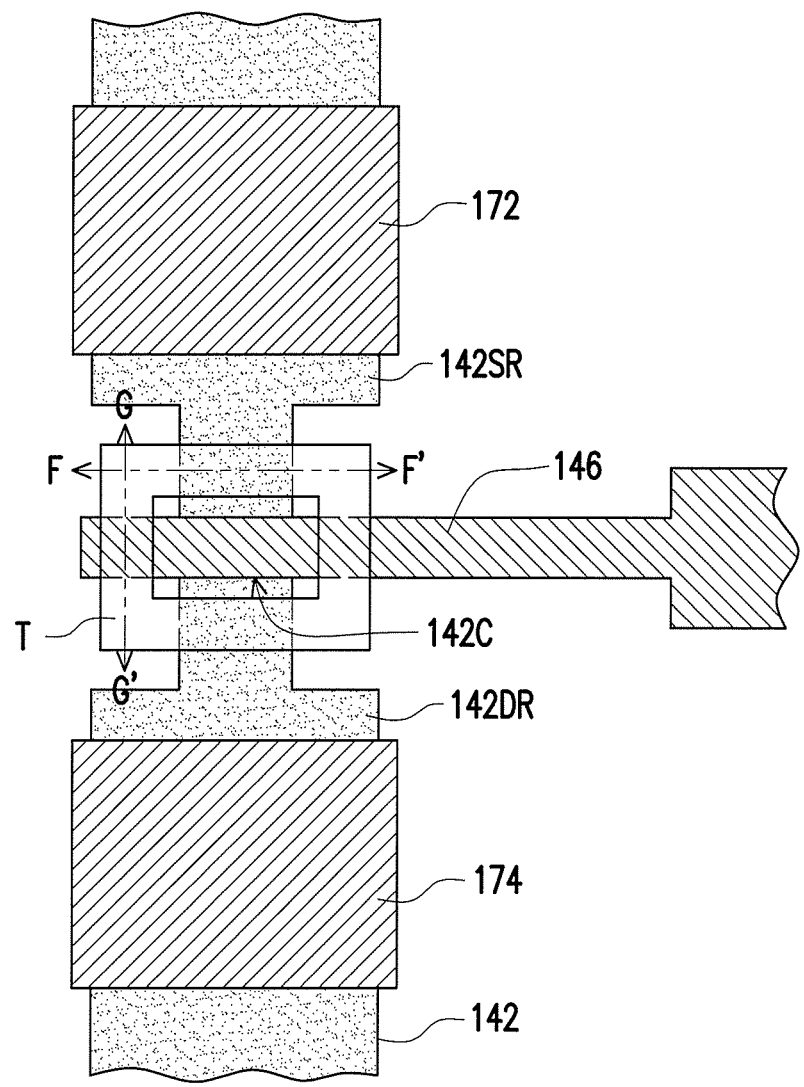
FIG. 15 is a plan view schematic diagram of a semiconductor device according to a fifth embodiment of the disclosure.
Figure 16A:
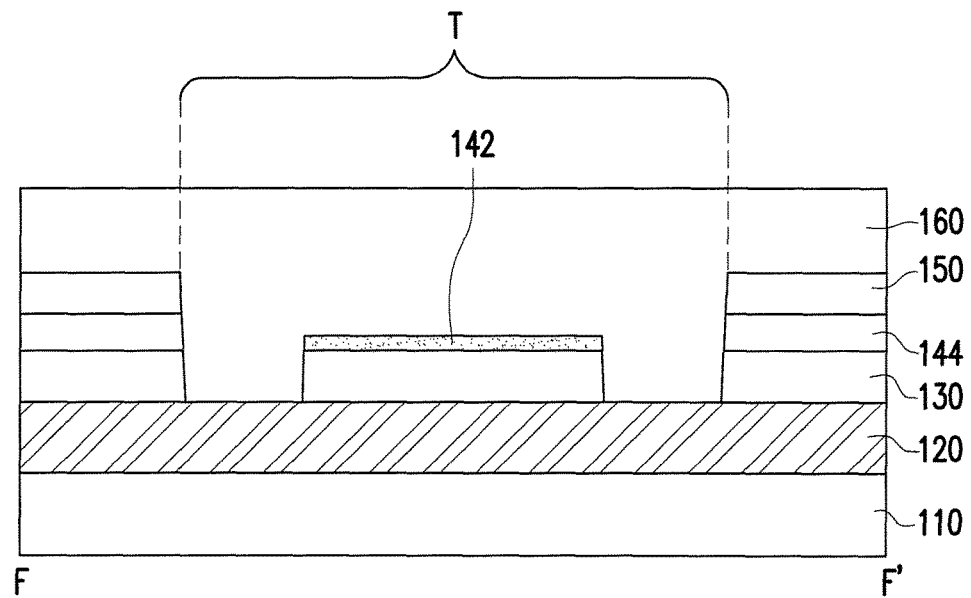
FIG. 16A is a cross sectional schematic diagram along the section line F-F' of FIG. 15.
Figure 16B:
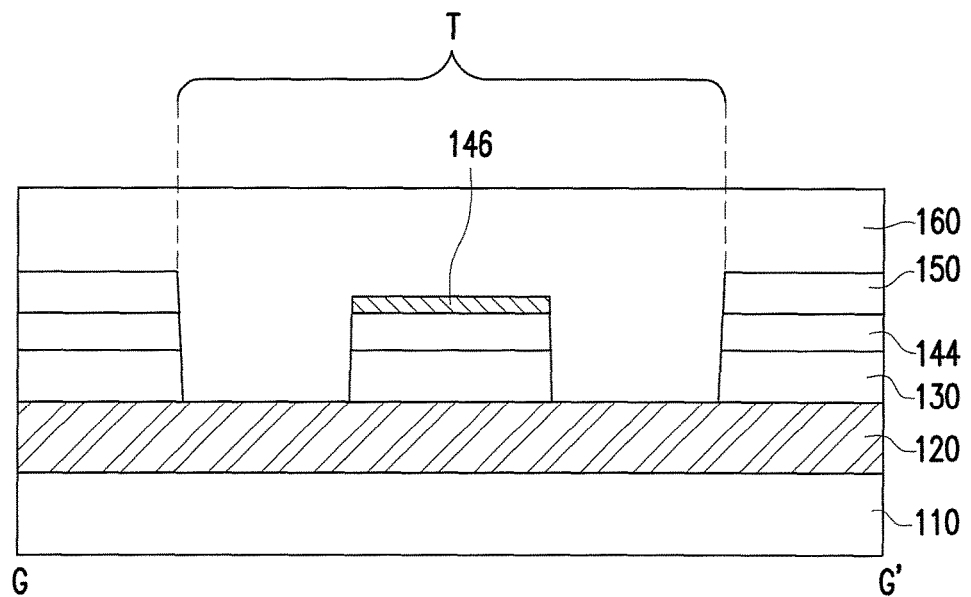
FIG. 16B is a cross sectional schematic diagram along the section line G-G' of FIG. 15.

FIG. 15 is a plan view schematic diagram of a semiconductor device according to a fifth embodiment of the disclosure. FIG. 16A is a cross sectional schematic diagram along the section line F-F' of FIG. 15. FIG. 16B is a cross sectional schematic diagram along the section line G-G' of FIG. 15. The semiconductor device 500A of the present embodiment is similar with the semiconductor device 100A of FIG. 3, therefore the same reference numbers are used to refer to the same or like parts and its description will not be repeated herein. The difference between the semiconductor device 500A of FIG. 15 and the semiconductor device 100A of FIG. 3 lies in the difference of the location of the at least one trench. In the present embodiment, the at least one trench T surrounds the channel region 142C of the polysilicon layer 142, and the at least one trench T is disposed to overlap with the gate 146 and the polysilicon layer 142. In other words, the at least one trench T penetrates the dielectric material layer 150 and the heat insulating layer 130 and exposes the upper surface of the barrier layer 120; but also exposes the gate 146 and the upper surface of the polysilicon layer 142 at the same time.

Similarly, in the semiconductor device 500A of FIG. 16A and FIG. 16B, the dielectric material layer 150 and the heat insulating layer 130 have the at least one trench T through patterning, therefore the stress absorbing layer 160 may be filled into the at least one trench T of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 17A:
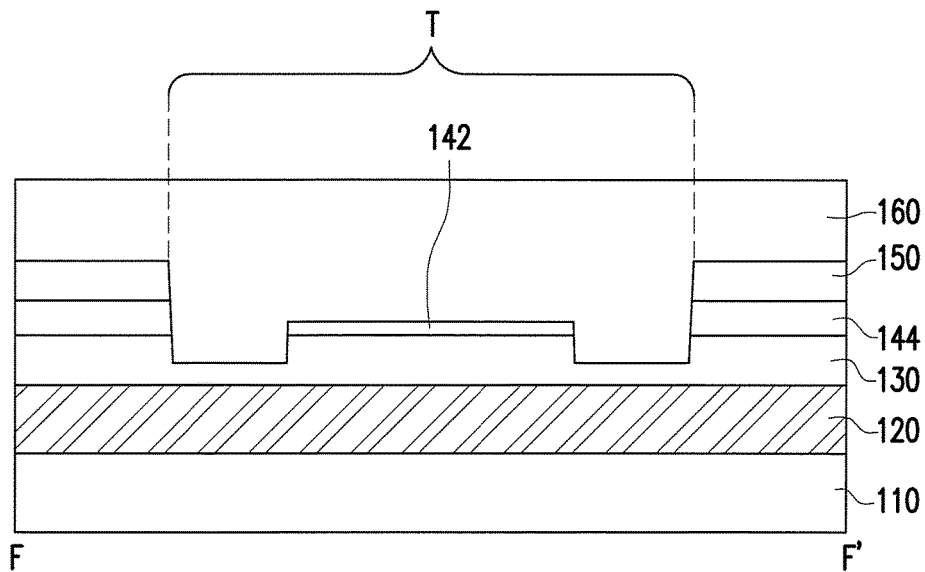
FIG. 17A is a cross sectional schematic diagram along the section line F-F' of FIG. 15 according to another embodiment.
Figure 17B:
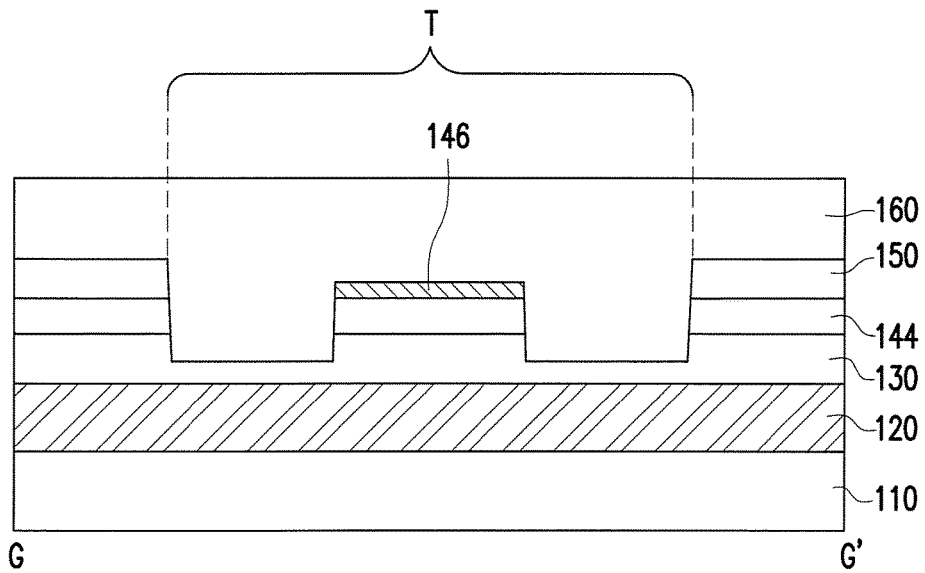
FIG. 17B is a cross sectional schematic diagram along the section line G-G' of FIG. 15 according to another embodiment.

FIG. 17A is a cross sectional schematic diagram along the section line F-F' of FIG. 15 according to another embodiment. FIG. 17B is a cross sectional schematic diagram along the section line G-G' of FIG. 15 according to another embodiment. The embodiment of FIG. 17A and FIG. 17B is similar to the embodiment of FIG. 16A and FIG. 16B, therefore the same reference numbers are used to refer to the same or like parts and its description will not be repeated herein. The difference between the semiconductor device 500B of FIG. 17A and FIG. 17B and the semiconductor device 500A of FIG. 16A and FIG. 16B lies in the at least one trench T of FIG. 16A and FIG. 16B penetrate the dielectric material layer 150 and the heat insulating layer 130 and exposes the upper surface of the barrier layer 120. In comparison, in the embodiment of FIG. 17A and FIG. 17B, the at least one trench T penetrates the dielectric material layer 150 and extends into the heat insulating layer 130, but does not penetrate the heat insulating layer 130. That is to say, the at least one trench T of the present embodiment exposes the heat insulating layer 130; but also exposes the gate 146 and the upper surface of the polysilicon layer 142 at the same time.

Similarly, in the semiconductor device 500B of FIG. 17A and FIG. 17B, the dielectric material layer 150 and the heat insulating layer 130 have the at least one trench T through patterning, therefore the stress absorbing layer 160 may be filled into the at least one trench T of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 18:
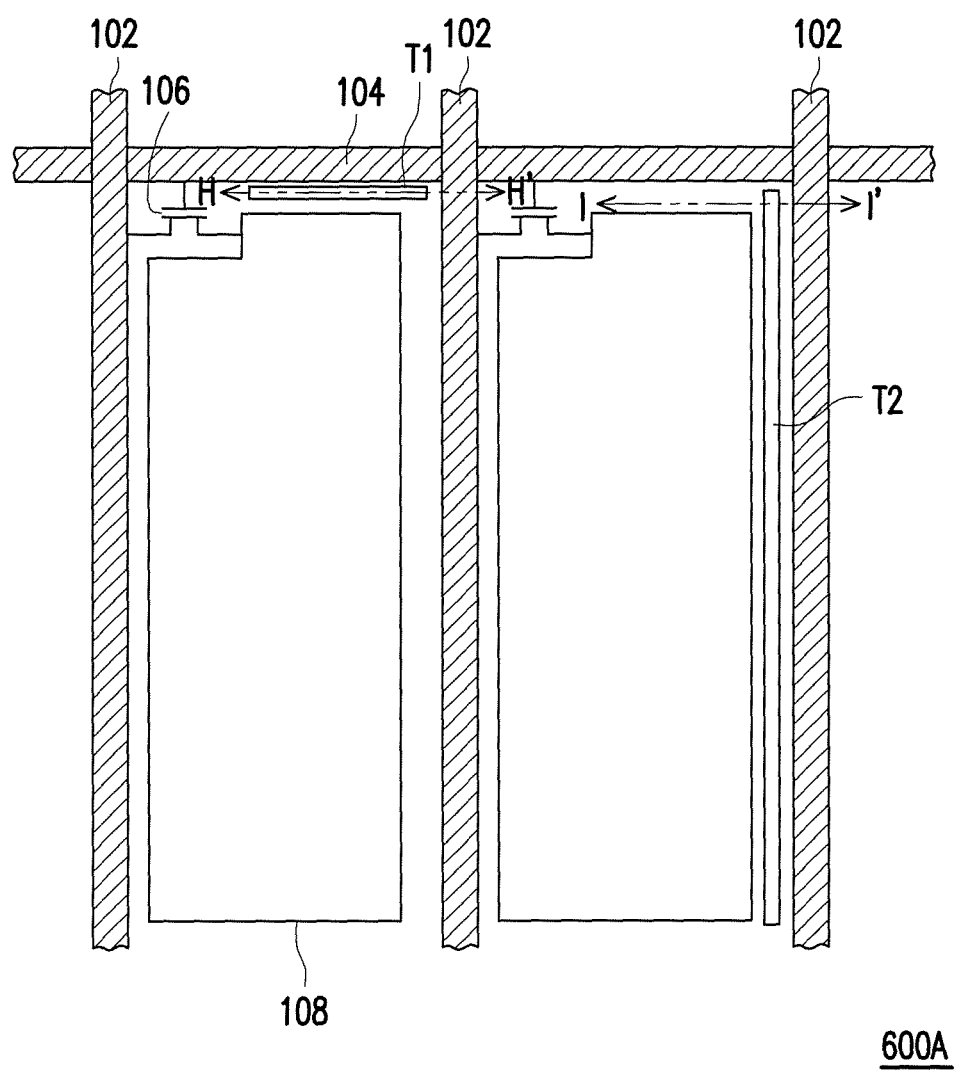
FIG. 18 is a plan view schematic diagram of a semiconductor device according to a sixth embodiment of the disclosure.
Figure 19A:
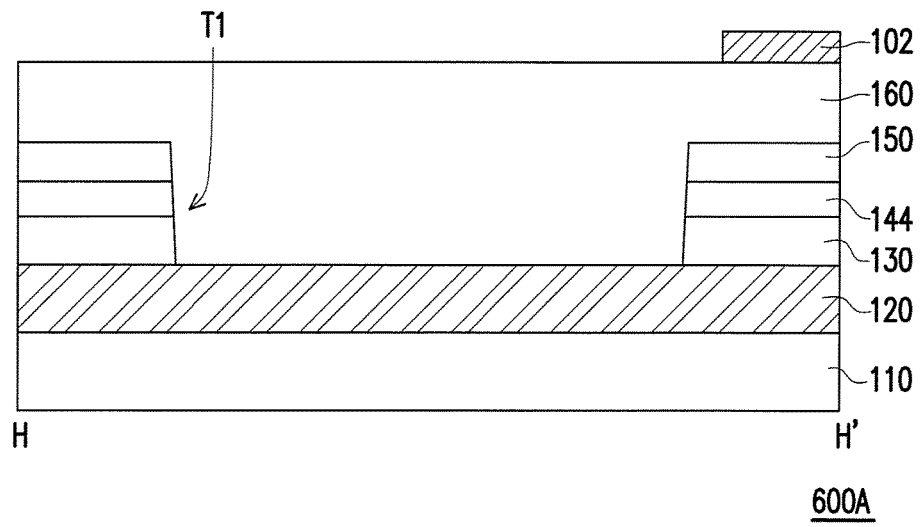
FIG. 19A is a cross sectional schematic diagram along the section line H-H' of FIG. 18.
Figure 19B:
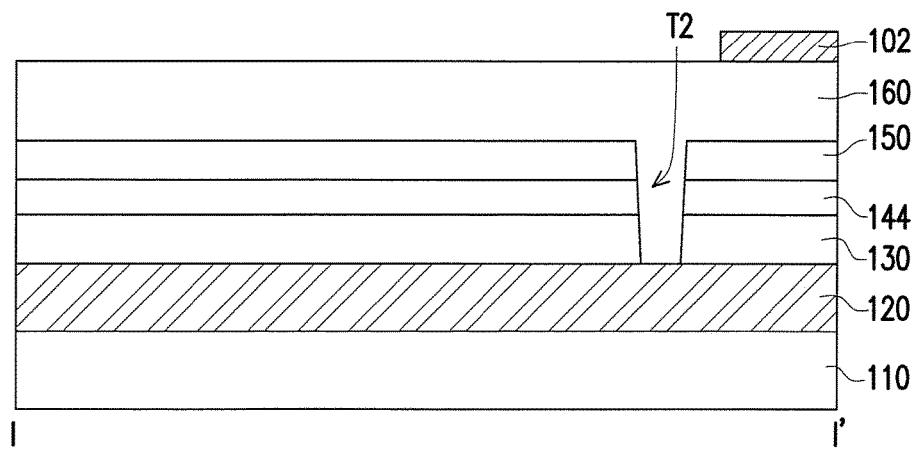
FIG. 19B is a cross sectional schematic diagram along the section line I-I' of FIG. 18.

FIG. 18 is a plan view schematic diagram of a semiconductor device according to a sixth embodiment of the disclosure. FIG. 19A is a cross sectional schematic diagram along the section line H-H' of FIG. 18. FIG. 19B is a cross sectional schematic diagram along the section line I-I' of FIG. 18. The semiconductor device 600A of FIG. 18, FIG. 19A and FIG. 19B is similar with the semiconductor device of FIG. 1, therefore the same reference numbers are used to refer to the same or like parts and its description will not be repeated herein. The difference between the semiconductor device 600A of FIG. 18, FIG. 19A and FIG. 19B and the semiconductor device of FIG. 1 lies in the device layer 140 includes a plurality of data lines 102, a plurality of scan lines 104 and a plurality of active devices 106, and the active devices 106 are electrically connected with pixel electrodes 108. In addition, the at least one trench is disposed adjacent to the data line 102 or the scan line 104, wherein the at least one trench T includes the first trench T1 and the second trench T2. The first trench T1 is disposed adjacent to the data line 102 and the second trench T2 is disposed adjacent to the scan lines 104. The present embodiment only illustrates one first trench T1 and one second trench T2, however the disclosure is not limited thereto. For example, in other embodiments, the first trench T1 may be selectively disposed in parallel with the scan line 104 between any of the data lines 102 and the next data line 102, and the second trench T2 may be selectively disposed in parallel with the data lines 102 between any of the scan lines 104 and the next scan line 104. That is to say, the first trench T1 and the second trench T2 may be disposed selectively in combination to be adjacent to the data lines 102 and the scan lines 104.

Similarly, in the semiconductor device 600A of FIG. 19A and FIG. 19B, the dielectric material layer 150 and the heat insulating layer 130 have the first trench T1 and the second trench T2 through patterning, therefore the stress absorbing layer 160 may be filled into the first trench T1 and the second trench T2 of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Furthermore, in the embodiments shown in FIG. 18, FIG. 19A and FIG. 19B, the positioning of the trenches surrounding the active devices 106 are not particularly described. In the active devices 106 of FIG. 18, a plurality of trenches may be positioned at one side, two sides of the active devices 106, or surrounding the active device 106 according to the embodiments shown in FIG. 1 to FIG. 17B above. For instance, by considering the embodiments shown in FIG. 3 or FIG. 6, trenches may be located at two sides of the polysilicon layer (not shown) in the active device 106 of FIG. 18, such that the trenches overlap or do not overlap with the gate (not shown). Similarly, by considering the embodiment shown in FIG. 9, trenches may be located at two sides of the gate of FIG. 18, such that the trenches overlap with the polysilicon layer. In addition, by considering the embodiment shown in FIG. 12, trenches may be surrounding three sides of the gate in the active devices 106 of FIG. 18. Alternatively, by considering the embodiment shown in FIG. 15, trenches may be surrounding the channel region of the polysilicon layer in the active device 106 of FIG. 18.

Figure 20A:
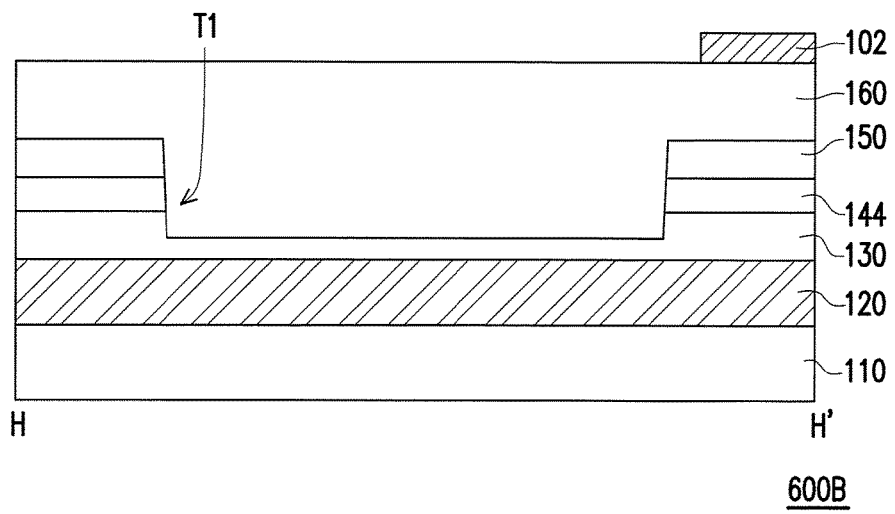
FIG. 20A is a cross sectional schematic diagram along the section line H-H' of FIG. 18 according to another embodiment.
Figure 20B:
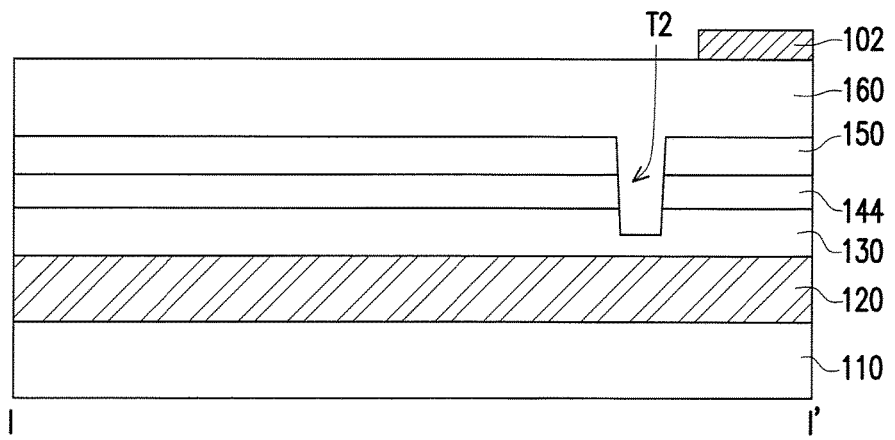
FIG. 20B is a cross sectional schematic diagram along the section line I-I' of FIG. 18 according to another embodiment.

FIG. 20A is a cross sectional schematic diagram along the section line H-H' of FIG. 18 according to another embodiment. FIG. 20B is a cross sectional schematic diagram along the section line I-I' of FIG. 18 according to another embodiment. The semiconductor device 600B of FIGS. 20A and 20B is similar to the semiconductor device 600A of FIGS. 19A and 19B, therefore the same reference numbers are used to refer to the same or like parts and its description will not be repeated herein. The difference being the first trench T1 and the second trench T2 of FIG. 19A and FIG. 19B penetrate the dielectric material layer 150 and the heat insulating layer 130 and exposes the upper surface of the barrier layer 120. In comparison, in the embodiment of FIG. 20A and FIG. 20B, the first trench T1 and the second trench T2 penetrate the dielectric material layer 150 and extend into the heat insulating layer 130, but do not penetrate the heat insulating layer 130. That is to say, the first trench T1 and the second trench T2 of the present embodiment exposes the heat insulating layer 130.

Similarly, in the semiconductor device 600B of FIG. 20A and FIG. 20B, the dielectric material layer 150 and the heat insulating layer 130 have the first trench T1 and the second trench T2 through patterning, therefore the stress absorbing layer 160 may be filled into the first trench T1 and the second trench T2 of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Figure 21:
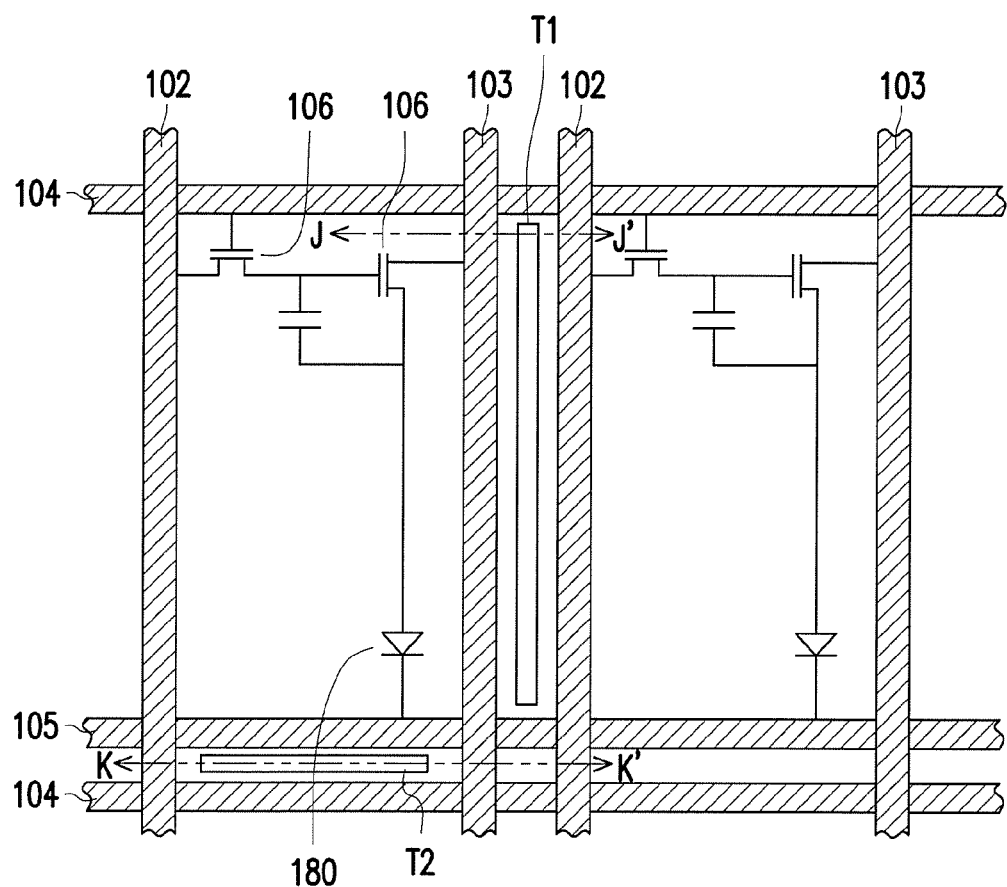
FIG. 21 is a plan view schematic diagram of a semiconductor device according to a seventh embodiment of the disclosure.
Figure 22A:
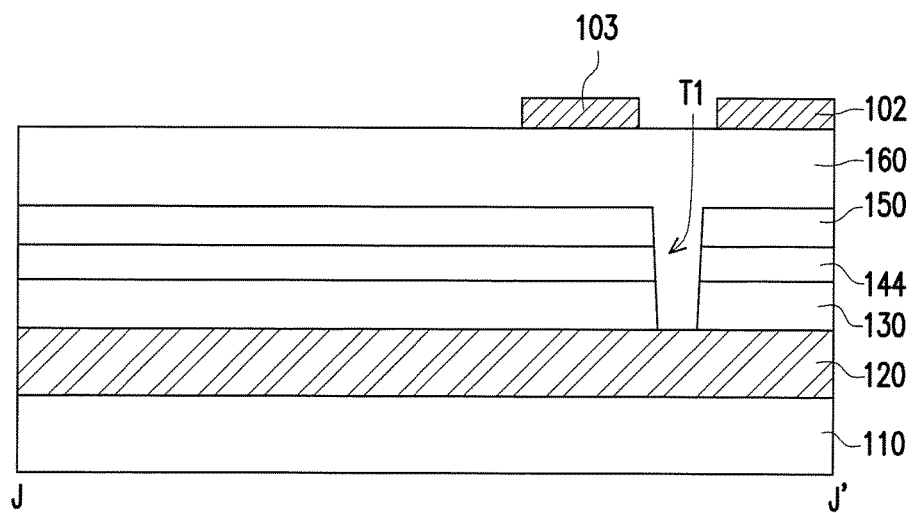
FIG. 22A is a cross sectional schematic diagram along the section line J-J' of FIG. 21.
Figure 22B:
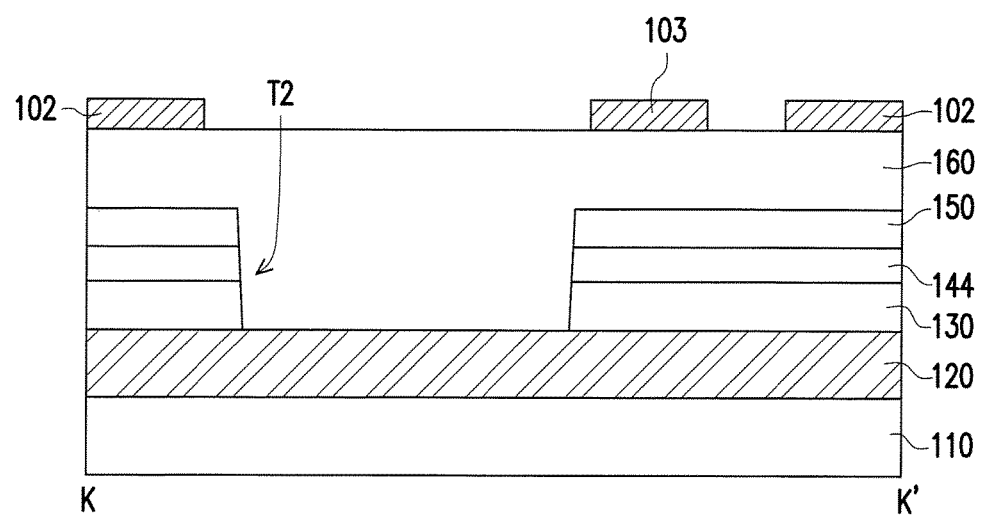
FIG. 22B is a cross sectional schematic diagram along the section line K-K' of FIG. 21.

FIG. 21 is a plan view schematic diagram of a semiconductor device according to a seventh embodiment of the disclosure. FIG. 22A is a cross sectional schematic diagram along the section line J-J' of FIG. 21. FIG. 22B is a cross sectional schematic diagram along the section line K-K' of FIG. 21. The semiconductor device 700A of FIGS. 22A and 22B is similar to the semiconductor device of FIGS. 19A and 19B, therefore the same reference numbers are used to refer to the same or like parts and its description will not be repeated herein. The difference between the semiconductor device 700A of FIGS. 22A and 22B and the semiconductor device 600A of FIGS. 19A and 19B lies in, for the semiconductor device 700A of FIGS. 22A and 22B, the device layer 140 includes the plurality of data lines 102, the plurality of scan lines 104, a plurality of power lines 103, a plurality of signal lines 105 and the plurality of active devices 106, wherein the active devices 106 is electrically connected with a light emitting diode 180. The at least one trench includes the first trench T1 and the second trench T2. The first trench T1 is located between the power line 103 and the data lines 102. The second trench T2 is located between the signal line 105 and the scan lines 104. The present embodiment only illustrates one first trench T1 and one second trench T2, however the disclosure is not limited thereto. For example, in other embodiments, the first trench T1 may be selectively disposed in parallel with the data line 102 between any of the power lines 103 and the next data line 102, and the second trench T2 may be selectively disposed in parallel with scan lines 104 between any of the signal line 105 and the next scan line 104. That is to say, the first trench T1 and the second trench T2 may be disposed selectively in combination between the power line 103 and the data lines 102 and between the signal line 105 and the scan lines 104.

Similarly, in the semiconductor device 700A of FIG. 22A and FIG. 22B, the dielectric material layer 150, the gate insulation layer 144 and the heat insulating layer 130 have the first trench T1 and the second trench T2 through patterning, therefore the stress absorbing layer 160 may be filled into the first trench T1 and the second trench T2 of the dielectric material layer 150, the gate insulation layer 144 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

Furthermore, in the embodiments shown in FIG. 21, FIG. 22A and FIG. 22B, the positioning of the trenches surrounding the active devices 106 are not particularly described. In the active devices 106 of FIG. 21, a plurality of trenches may be positioned at one side, two sides of the active devices 106, or surrounding the active device 106 according to the embodiments shown in FIG. 1 to FIG. 17B above. For instance, by considering the embodiments shown in FIG. 3 or FIG. 6, trenches may be located at two sides of the polysilicon layer (not shown) in the active device 106 of FIG. 21, such that the trenches overlap or do not overlap with the gate (not shown). Similarly, by considering the embodiment shown in FIG. 9, trenches may be located at two sides of the gate of FIG. 21, such that the trenches overlap with the polysilicon layer. In addition, by considering the embodiment shown in FIG. 12, trenches may be surrounding three sides of the gate in the active devices 106 of FIG. 21. Alternatively, by considering the embodiment shown in FIG. 15, trenches may be surrounding the channel region of the polysilicon layer in the active device 106 of FIG. 21.

Figure 23A:
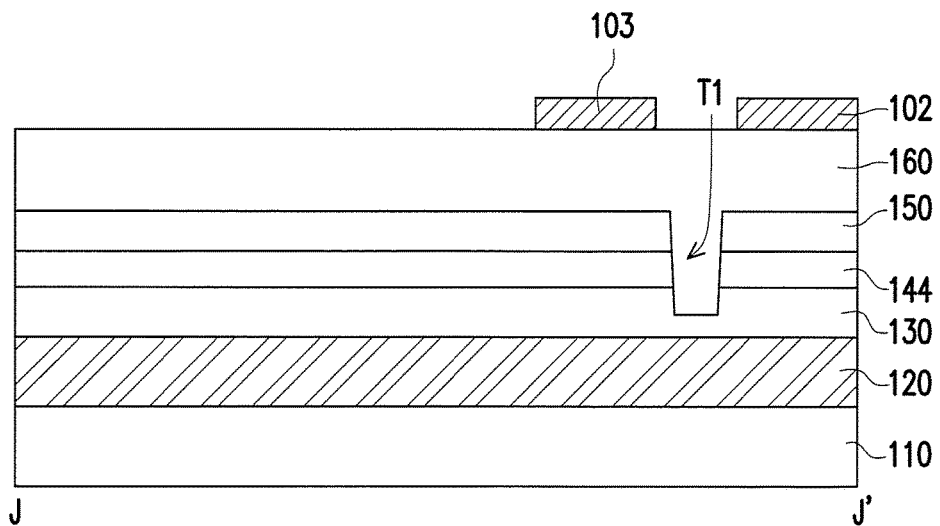
FIG. 23A is a cross sectional schematic diagram along the section line J-J' of FIG. 21 according to another embodiment.
Figure 23B:
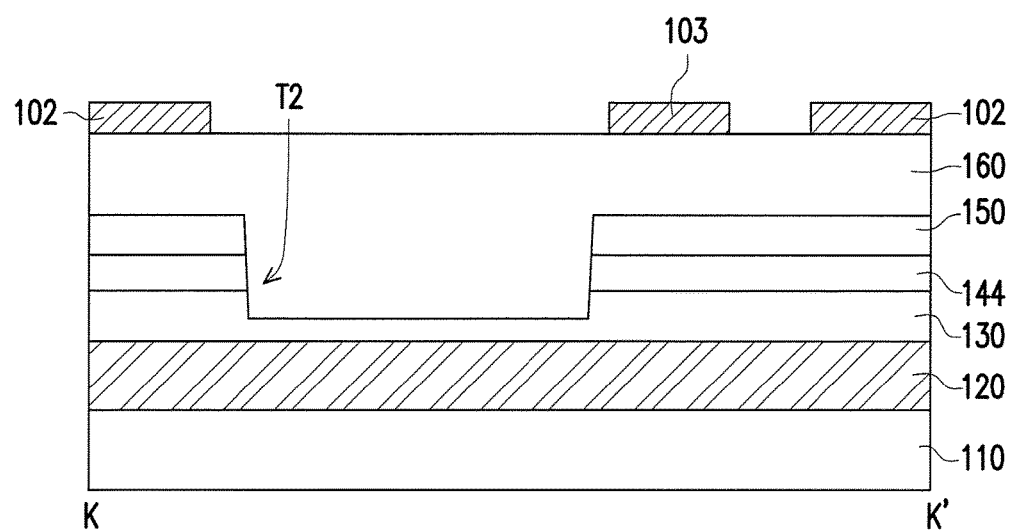
FIG. 23B is a cross sectional schematic diagram along the section line K-K' of FIG. 21 according to another embodiment.

FIG. 23A is a cross sectional schematic diagram along the section line J-J' of FIG. 21 according to another embodiment. FIG. 23B is a cross sectional schematic diagram along the section line K-K' of FIG. 21 according to another embodiment. The semiconductor device 700B of FIGS. 23A and 23B is similar to the semiconductor device 700 A of FIGS. 22A and 22B, therefore the same reference numbers are used to refer to the same or like parts and its description will not be repeated herein. The difference lies in, the first trench T1 and the second trench T2 of FIG. 22A and FIG. 22B penetrate the dielectric material layer 150, the gate insulation layer 144 and the heat insulating layer 130 and exposes the upper surface of the barrier layer 120. In comparison, in the embodiment of FIG. 23A and FIG. 23B, the first trench T1 and the second trench T2 penetrate the dielectric material layer 150, the gate insulation layer 144 and extend into the heat insulating layer 130, but do not penetrate the heat insulating layer 130. That is to say, the first trench T1 and the second trench T2 of the present embodiment exposes the heat insulating layer 130.

Similarly, in the semiconductor device 700B of FIG. 23A and FIG. 23B, the dielectric material layer 150, the gate insulation layer 144 and the heat insulating layer 130 have the first trench T1 and the second trench T2 through patterning, therefore the stress absorbing layer 160 may be filled into the first trench T1 and the second trench T2 of the dielectric material layer 150 and the heat insulating layer 130. Accordingly, during flexing of a product with a semiconductor device having the aforementioned structure, it is possible for the flex to be within an elastic deformation range, or to change within a linear deformation range. In other words, the aforementioned structure may be used to improve the poor stress distribution, and the flexibility of the semiconductor may be increased and may protect the semiconductor device.

EXPERIMENTAL EXAMPLES

To show that the semiconductor device of the disclosure may improve the poor stress distribution and may increase the flexibility of the semiconductor device, the following comparative examples and experiment examples are described below.

Comparative Example X1

A semiconductor device in comparative example X1 of the disclosure is similar with the semiconductor device in the embodiment of FIG. 1. The difference lies in, for the semiconductor device of comparative example X1, the dielectric material layer and the heat insulating layer do not include the at least one trench and do not include a stress absorbing layer.

Experimental Example E1

A semiconductor device in experimental example E1 of the disclosure is similar with the semiconductor device in the embodiment of FIG. 1. The difference lies in, for the semiconductor device of experimental example E1, the dielectric material layer and the heat insulating layer have the at least one trench but do not include the use of a stress absorbing layer for the stress absorbing layer to fill into the at least one trench.

Experimental Example E2

A semiconductor device in experimental example E2 of the disclosure is a semiconductor device in reference to FIG. 1. In the semiconductor device of the present experimental example E2, the dielectric material layer and the heat insulating layer include the at least one trench, and the stress absorbing layer fills into the at least one trench.

Below is a simulation analysis of the stress distribution on the polysilicon layer of the semiconductor device of comparative example X1, experimental example E1 and experimental example E2 when bended. The experiment results are as shown in FIG. 24.

Figure 24:
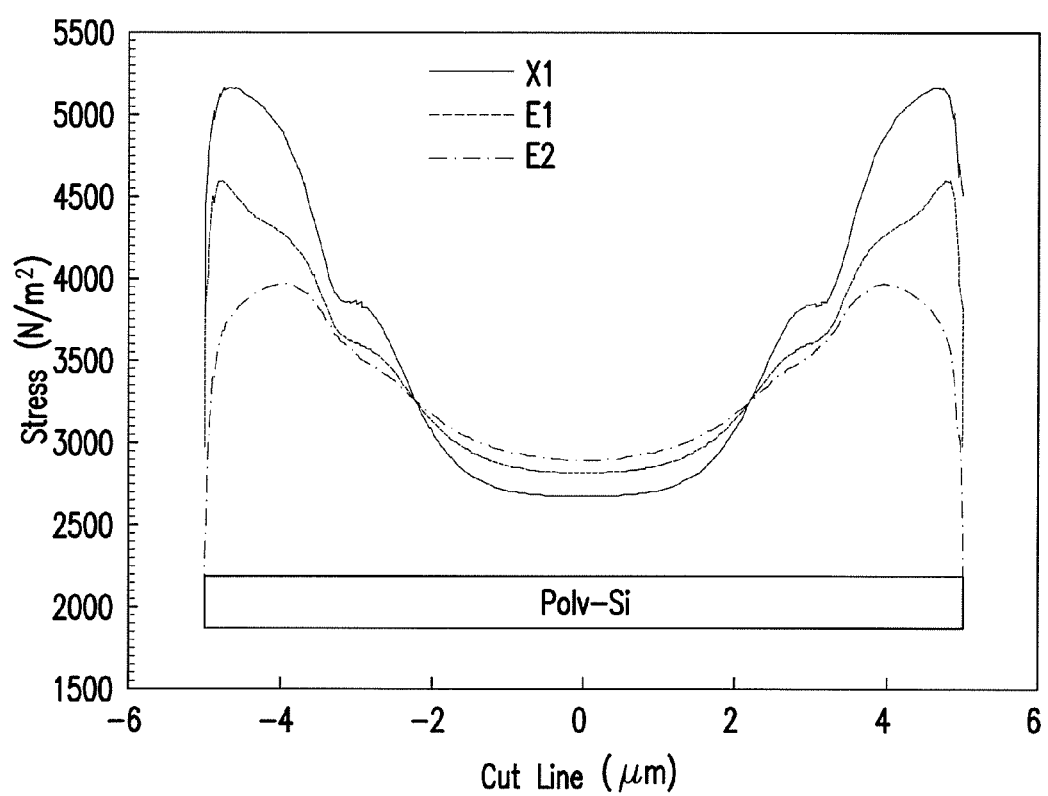
FIG. 24 is a comparison diagram of a stress distribution of a polysilicon layer according to an embodiment of the disclosure.

FIG. 24 is a comparison diagram of a stress distribution of a polysilicon layer according to an embodiment of the disclosure. Referring to FIG. 24, when the semiconductor device of comparative example X1 is bended, the stress around the periphery of the polysilicon layer is the highest and the stress at a central portion is the lowest. In other words, the stress distribution in the semiconductor device of comparative example X1 is poor. When the dielectric material layer and the heat insulating layer of the semiconductor device includes at least one trench, then as shown in experimental example E1, the stress around the periphery of the polysilicon layer is reduced, such that the stress distribution is more even. More particularly, when the dielectric material layer and the heat insulating layer of the semiconductor device includes the at least one trench and the stress absorbing layer is filled into the at least one trench, then as shown in experimental example E2, the stress around the periphery of the polysilicon layer may be reduced to a greater extent, and the stress distribution is more even. As shown through the aforementioned experimental results, for a product having the semiconductor device of the disclosure, it is possible for the flex to be within an elastic deformation range, or to change within a linear deformation range. In other words, the aforementioned structure may be used to improve the poor stress distribution, and the flexibility of the semiconductor may be increased.

In summary, in a semiconductor device of the disclosure, a dielectric material layer and a heat insulating layer include at least one trench, and a stress absorbing layer is filled into the at least one trench. Therefore, when the semiconductor device of the disclosure is bended, the poor stress distribution may be improved and the flexibility of the semiconductor device is increased and may protect the semiconductor device. That is to say, the semiconductor device of the disclosure may be used to prevent the film layer from cracking when the panel is bended, and the problem of the thin film transistor and the capacitance drifting and deteriorating may be prevented.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A semiconductor device, comprising:
   a flexible substrate;
   a barrier layer, disposed on the flexible substrate, wherein a water vapor transmission rate of the barrier layer is smaller than $10^{-5}$ g/m$^2$/day and a thickness of the barrier layer is smaller than 500 nm;
   a heat insulating layer, disposed on the barrier layer, wherein the heat insulating layer has a thermal conductivity of less than 20 W/mK;
   a device layer, disposed on the heat insulating layer;
   a dielectric material layer, disposed on the device layer, wherein the dielectric material layer and the heat insulating layer include at least one trench; and
   a stress absorbing layer, disposed on the dielectric material layer, and the stress absorbing layer fills into the at least one trench.

2. The semiconductor device as claimed in claim 1, wherein the device layer comprises a plurality of active devices, wherein each of the active devices comprises:
   a polysilicon layer, wherein the polysilicon layer comprises a source region, a drain region, and a channel region located between the source region and the drain region;
   a gate insulation layer, disposed on the polysilicon layer; and
   a gate, disposed on the gate insulation layer.

3. The semiconductor device as claimed in claim 2, further comprising a source electrode and a drain electrode, wherein the source electrode is connected with the source region through a first opening, and the first opening penetrates the stress absorbing layer, the dielectric material layer and the gate insulation layer, and the drain electrode is connected with the drain region through a second opening, and the second opening penetrates the stress absorbing layer, the dielectric material layer and the gate insulation layer.

4. The semiconductor device as claimed in claim 2, wherein the at least one trench comprises a first trench and a second trench, the first trench and the second trench are located at two sides of the polysilicon layer, the first trench is disposed to not overlap the gate, and the second trench is disposed to overlap the gate.

5. The semiconductor device as claimed in claim 2, wherein the at least one trench comprises a first trench and a second trench, the first trench and the second trench are located at two sides of the polysilicon layer, and the first trench and the second trench are disposed to overlap with the gate.

6. The semiconductor device as claimed in claim 2, wherein the at least one trench includes a first trench and a second trench, the first trench and the second trench are located at two sides of the gate, and the first trench and the second trench are disposed to overlap with the polysilicon layer.

7. The semiconductor device as claimed in claim 2, wherein the at least one trench surrounds the gate, and the at least one trench is disposed to overlap with the polysilicon layer.

8. The semiconductor device as claimed in claim 2, wherein the at least one trench surrounds the channel region of the polysilicon layer, and the at least one trench is disposed to overlap with the gate and the polysilicon layer.

9. The semiconductor device as claimed in claim 1, wherein the device layer comprises a plurality of data lines, a plurality of scan lines and a plurality of active devices, and the at least one trench is disposed adjacent to the data lines or the scan lines.

10. The semiconductor device as claimed in claim 9, wherein the at least one trench is located at two sides of the plurality of active devices.

11. The semiconductor device as claimed in claim 1, wherein the device layer comprises a plurality of data lines, a plurality of scan lines, a plurality of power lines, a plurality of signal lines and a plurality of active devices, and the at least one trench is located between the power lines and the data lines, or the at least one trench is located between the signal lines and the scan lines.

12. The semiconductor device as claimed in claim 1, wherein the at least one trench penetrates the dielectric material layer and the heat insulating layer and exposes an upper surface of the barrier layer.

13. The semiconductor device as claimed in claim 1, wherein the at least one trench penetrates the dielectric material layer and extends into the heat insulating layer but does not penetrate the heat insulating layer.

14. The semiconductor device as claimed in claim 1, wherein the flexible substrate is an organic material and having a tolerance temperature of lower than 500° C.

15. The semiconductor device as claimed in claim 1, wherein the barrier layer comprises a plurality of layers of alternately stacked oxide material layers and nitride material layers, wherein the nitride material layer is located at the top of the barrier layer.

16. The semiconductor device as claimed in claim 15, wherein the nitride material layer is in contact with the heat insulating layer.

17. The semiconductor device as claimed in claim 1, further comprising a etching stop layer, wherein the etching stop layer is located between the barrier layer and the heat insulating layer, and the at least one trench exposes the etching stop layer.

18. The semiconductor device as claimed in claim 1, further comprising a patterned etching stop layer, wherein the patterned etching stop layer is located on the barrier layer, the heat insulating layer covers the patterned etching stop layer, the at least one trench exposes the etching stop layer, and the etching stop layer is disposed to not overlap with a gate of the device layer.

19. The semiconductor device as claimed in claim 1, further comprising a patterned etching stop layer, wherein the patterned etching stop layer is located on the barrier layer, the heat insulating layer covers the patterned etching stop layer, the at least one trench exposes the etching stop layer, and the etching stop layer is disposed to not overlap with a polysilicon layer of the device layer.

* * * * *